United States Patent
Urakami et al.

(10) Patent No.: US 7,063,751 B2
(45) Date of Patent: Jun. 20, 2006

(54) SEMICONDUCTOR SUBSTRATE FORMED BY EPITAXIALLY FILLING A TRENCH IN A SEMICONDUCTOR SUBSTRATE WITH A SEMICONDUCTOR MATERIAL AFTER SMOOTHING THE SURFACE AND ROUNDING THE CORNERS

(75) Inventors: Yasushi Urakami, Tokai (JP); Shoichi Yamauchi, Obu (JP); Hitoshi Yamaguchi, Obu (JP); Nobuhiro Tsuji, Okazaki (JP)

(73) Assignee: Denso Corporation, Kariya (JP)

( * ) Notice: Subject to any disclaimer, the term of this patent is extended or adjusted under 35 U.S.C. 154(b) by 145 days.

(21) Appl. No.: 10/132,298

(22) Filed: Apr. 26, 2002

(65) Prior Publication Data

US 2002/0158301 A1 Oct. 31, 2002

Related U.S. Application Data

(63) Continuation of application No. 09/870,705, filed on Jun. 1, 2001, now Pat. No. 6,406,982.

(30) Foreign Application Priority Data

Jun. 5, 2000 (JP) .................. 2000-167822
Oct. 13, 2000 (JP) .................. 2000-313918

(51) Int. Cl.
- *H01L 29/12* (2006.01)
- *H01L 29/30* (2006.01)
- *H01L 21/20* (2006.01)
- *H01L 21/36* (2006.01)
- *H01L 29/04* (2006.01)

(52) U.S. Cl. .................. 148/33.4; 148/33.2; 257/627; 438/503; 438/504

(58) Field of Classification Search .............. 438/503, 438/504; 148/33.2, 33.4; 257/627
See application file for complete search history.

(56) References Cited

U.S. PATENT DOCUMENTS

| 3,753,803 A | * | 8/1973 | Nomura et al. ............. 438/416 |
| 4,466,173 A | | 8/1984 | Baliga |
| 4,528,745 A | | 7/1985 | Muraoka et al. |
| 5,216,275 A | | 6/1993 | Chen |

(Continued)

FOREIGN PATENT DOCUMENTS

| EP | 0053854 | 6/1982 |
| EP | 0975024 | 1/2000 |
| JP | A-51-107768 | 9/1976 |
| JP | A-53-94775 | 8/1978 |
| JP | A-59-181529 | 10/1984 |
| JP | A-59-232439 | 12/1984 |
| JP | A-63-111611 | 5/1988 |
| JP | A-1-222436 | 9/1989 |
| JP | A-2-111062 | 4/1990 |
| JP | A-3-11629 | 1/1991 |
| JP | A-9-199379 | 7/1997 |

OTHER PUBLICATIONS

IBM Technical disclosure Bulletin NA80122863, Dec. 1980, vol. 23(7A), pp. 2863–2865.*

(Continued)

*Primary Examiner*—Erik Kielin
(74) *Attorney, Agent, or Firm*—Posz Law Group, PLC

(57) ABSTRACT

A trench is formed in a semiconductor substrate through a mask composed of a silicon oxide film formed on the semiconductor substrate. Then, an edge portion at an opening portion of the mask is etched so that the width of the mask opening width is greater than the width of the trench. After that, the inner surface of the trench is smoothed by thermal treatment around at 1000° C. in non-oxidizing or non-nitriding atmosphere under low pressure. Then, the trench is filled with an epitaxial film. After that, the epitaxial film is polished to complete the substrate.

5 Claims, 23 Drawing Sheets

U.S. PATENT DOCUMENTS

| | | | |
|---|---|---|---|
| 5,438,215 | A | 8/1995 | Tihanyi |
| 5,821,158 | A | 10/1998 | Shishiguchi |
| 6,030,887 | A * | 2/2000 | Desai et al. ............... 438/507 |
| 6,040,211 | A | 3/2000 | Schrems |
| 6,287,941 | B1 * | 9/2001 | Kang et al. ............... 438/459 |
| 6,291,310 | B1 * | 9/2001 | Madson et al. ............ 438/424 |
| 2001/0034109 | A1 * | 10/2001 | Madson et al. ............ 438/412 |

OTHER PUBLICATIONS

Smeltzer, "Epitaxial Deposition of Silicon in Deep Grooves" Journal of the Electrochemical Society vol. 122, Dec. 1975, pp. 1666–1671.*

Yamauchi et al., "Defect–less trench filling of epitaxial Si growth by H2 annealing" IEEE Proceedings of the 14th International Symposium on Power Semiconductor Devices and ICs, 2002, pp. 133–136.*

Moriceau et al. "Hydrogen annealing treatment used to obtain high quality SOI surfaces" IEEE International SOI Conference Oct. 1998, pp. 37–38.*

Sato, T. et al. "A New Substrate Engineering for the Formation of Empty Space In Silicon (ESS) Induced by Silicon Surface Migration" (Apr. 2000), pp. 1–5.

* cited by examiner

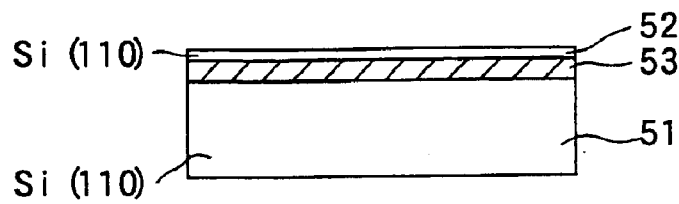
FIG. 6A
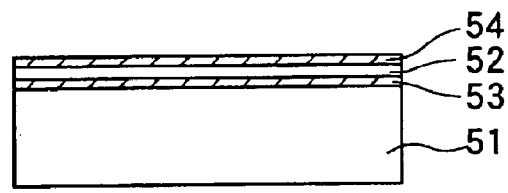
FIG. 6B
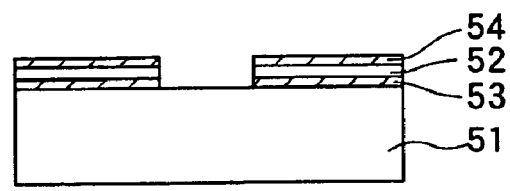
FIG. 6C
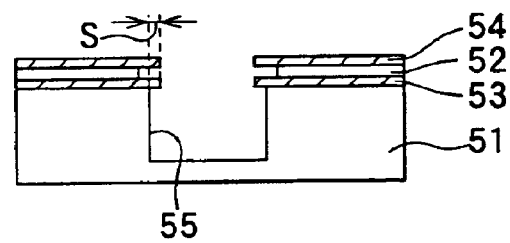
FIG. 6D
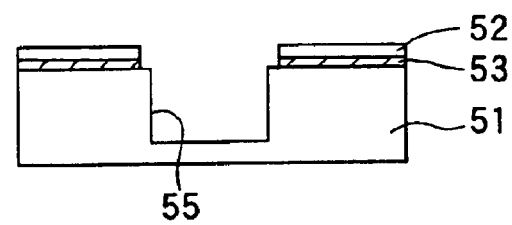
FIG. 6E
FIG. 7
UNIT: μm
| DEPTH OF TRENCH | PROTRUDING AMOUNT |
|---|---|
| 10 | 0.15 |
| 20 | 0.3 |
| 35 | 0.53 |
| 50 | 0.76 |
TABLE

SEMICONDUCTOR SUBSTRATE FORMED BY EPITAXIALLY FILLING A TRENCH IN A SEMICONDUCTOR SUBSTRATE WITH A SEMICONDUCTOR MATERIAL AFTER SMOOTHING THE SURFACE AND ROUNDING THE CORNERS

CROSS REFERENCE TO RELATED APPLICATIONS

This application is a continuation of U.S. patent application Ser. No. 09/870,705, now U.S. Pat. No. 6,406,982 B2, which was filed on Jun. 1, 2001.

BACKGROUND OF THE INVENTION

The present invention relates to a semiconductor device having a smooth trench, in particular, a trench filled with a diffusion layer.

With regard to a semiconductor device having a trench filled with a diffusion layer, a manufacturing method for making a prototype of the device is shown in FIGS. 8A to 8D.

As shown in FIG. 21A, a silicon substrate 201 having a silicon oxide film 202 formed on a surface thereof is prepared. Subsequently, after an opening portion is formed in the silicon oxide film 202 at a predetermined region by photo-etching, dry etching or wet etching is performed to form a trench 203 in the silicon substrate 201 by applying the silicon oxide film having the opening portion as a mask as shown in FIG. 21B. After that, the trench 203 is filled with an epitaxial film 204 in which impurities are doped as shown in FIG. 21C. Then, the epitaxial film 204 is polished by applying the silicon oxide film 202 as a stopper, so that a polycrystalline silicon layer 205 is flattened as shown in FIG. 21D. Through the steps described above, the semiconductor device having the trench 203 filled with the diffusion layer is completed.

FIG. 22A shows an enlarged cross sectional view of the semiconductor device shown in FIG. 21B after the trench 203 is formed. FIG. 22B shows an enlarged cross sectional view of the semiconductor device shown in FIG. 21C when the epitaxial film is formed. In the method described above, the silicon oxide film 202 is used both as the mask for forming the trench and as the stopper for flattening the epitaxial film. Therefore, the epitaxial film is formed on the silicon oxide film 202 which is left as it is after the trench is formed.

However, during the step shown in FIG. 22B, the opening width of the trench 203 becomes wider than that of the opening portion of the silicon oxide film 202, so that an edge of the silicon oxide film 202 protrudes from an inner surface of the trench 203 in parallel to a surface of the silicon substrate to form a protrusion 202a as shown in FIG. 22A. Therefore, when the epitaxial film is grown in the step shown in FIG. 21C, polycrystalline silicon grows on the protrusion 202a, which causes increase of crystal defects in the epitaxial film 204. Since a growth rate of polycrystalline silicon is larger than that of single crystal silicon, an opening portion of the trench 203 is shut up by polycrystalline silicon portion 205. As a result, a void in filling the trench is generated in the trench 203.

Another problem is explained with reference to FIGS. 26A and 26B. These figures show schematic cross sectional views of a prototype device based on a cross sectional SEM image. FIG. 26A shows a schematic cross sectional view after a trench etching is performed. FIG. 26B shows a schematic cross sectional view after epitaxial growth for filling the trench is performed.

When a silicon substrate having a (1 1 0) face orientation is used as a substrate and when a trench is formed in the substrate at a width of 18 μm and a depth of 13.5 μm, an increase in the crystal defects occurs in a part of epitaxial film formed on a bottom surface of the trench. This may be caused by a roughness of Si (1 1 0) face located on the bottom surface of the trench larger than that of Si (1 1 1) face located on side face of the trench.

SUMMARY OF THE INVENTION

The present invention is devised to solve the above problems, and has an object to provide a manufacturing method of a semiconductor device having a trench filled with diffusion layer. The other object of the present invention is to fill a trench with an epitaxial film having high quality.

According to first aspect of the invention, after trench is formed by using a mask, at least an edge portion of the mask, which is located at an opening portion of the trench so as to protrude from an edge of the opening portion of the trench, is removed. After that, the trench is filled with an epitaxial film. In other words, when the trench is filled with an epitaxial film, an opening width of the mask is larger than that of the trench.

It is preferred that a protecting layer is formed on the mask, which is used for increasing the opening width of the mask. The protecting layer may be constituted by multiple layers.

It is preferred that an inner wall of the trench is flattened before the trench is filled with the epitaxial film. This flattening treatment improves the crystallinity of the inner wall of the trench. In other words, roughness and crystal defects are reduced by the flattening treatment.

A heat treatment in low pressure atmosphere including non-oxidizing gas or non-nitriding gas is applied as the flattening treatment.

Other objects and features of the present invention will become more readily apparent from a better understanding of the preferred embodiment described below with reference to the following drawings.

BRIEF DESCRIPTION OF THE DRAWINGS

FIGS. 6A to 6E are schematic cross sectional views of a semiconductor substrate having a trench showing manufacturing steps of a sixth embodiment of the present invention;

FIG. 7 is a table showing a relationship between the depth of a trench and a protruding amount;

DETAILED DESCRIPTION OF THE PREFERRED EMBODIMENTS

Figure 1A:
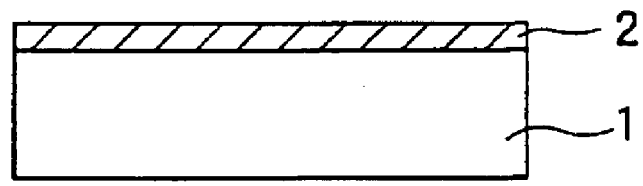
FIGS. 1A to 1D are schematic cross sectional views of a semiconductor substrate having a trench showing manufacturing steps of a first embodiment of the present invention.

Specific embodiments of the present invention will now be described hereinafter with reference to the accompanying drawings in which the same or similar component parts are designated by the same or similar reference numerals.

First Embodiment

Referring to FIG. 1A to FIG. 1D, a manufacturing method of a semiconductor device of first embodiment will be explained below.

[Step in FIG. 1A]

A silicon substrate 1 having a (1 1 0) face orientation is prepared. A thermal silicon oxide film having a thickness of about 425 Å is formed by oxidation on the silicon substrate 1. Subsequently, a silicon oxide film having a thickness of about 17000 Å is located on the thermal silicon oxide film by CVD, so that the silicon oxide film 2 is formed as a mask. After that, an annealing treatment is performed in a nitrogen ($N_2$) atmosphere.

Figure 1B:
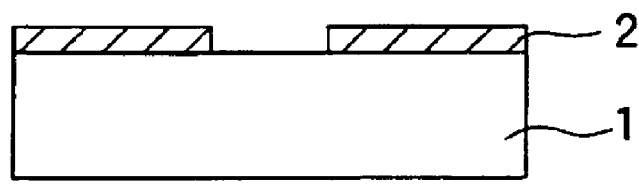

[Step in FIG. 1B]

The silicon oxide film 2 is patterned by dry etching, so that the silicon oxide film 2 is opened at a region where a trench is to be formed.

Figure 1C:
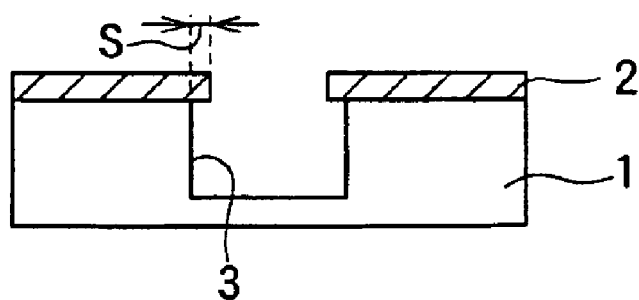

[Step in FIG. 1C]

A trench 3 is formed in the silicon substrate 1 at a depth of about 35 μm by etching through the silicon oxide film 2 as the mask. For example, wet etching having an etching rate of 1.4 μm/min is carried out for 25 minutes in an etching solution of 22 wt. % TMAH (TetraMethylAmmonium Hydroxide) solution at 90° C.

As a result, the trench 3 is formed. In addition, an opening width of the trench 3 is widened in a lateral direction by the wet etching in comparison with an opening portion of the silicon oxide film 2 serving as the mask, so that protrusions are formed in the silicon oxide film 2.

When an amount of the protrusions extending from an inner side surface of the trench 3 in the lateral direction is defined as a protruding amount S, the amount S in this embodiment is about 0.53 μm when the depth of the trench 3 is about 35 μm.

Incidentally, TMAH solution has a high etching selectivity of silicon oxide with respect to silicon. For example, in a case in which silicon oxide film serves as a mask and an etching solution of 22 wt. % TMAH solution is used at 90° C., the etching selectivity of silicon oxide with respect to silicon becomes 1/2000.

Figure 1D:
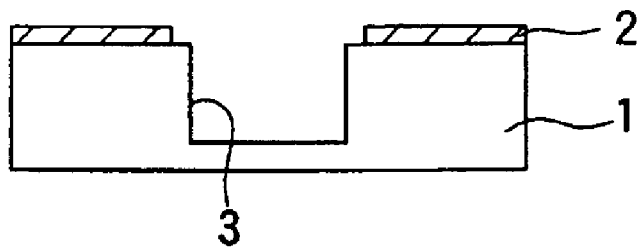

[Step in FIG. 1D]

The silicon oxide film 2 is etched so that the opening width of the silicon oxide film 2 is larger than that of the trench 3. In other words, a tip portion at an opening portion of the silicon oxide film 2 backs off an inner surface of the trench 3 in the lateral direction. Namely, a peripheral portion of the mask around the opening portion is removed so that the opening width of the silicon oxide film 2 is wider than that of the trench.

For example, when etching of the silicon oxide film 2 is conducted in hydrofluoric acid (HF) having an concentration of 1/50 with respect to water for 160 minutes, the tip portion at the opening portion of the silicon oxide film 2 backs off the inner surface of the trench 3 in the lateral direction at 0.37 μm.

Figure 21A:
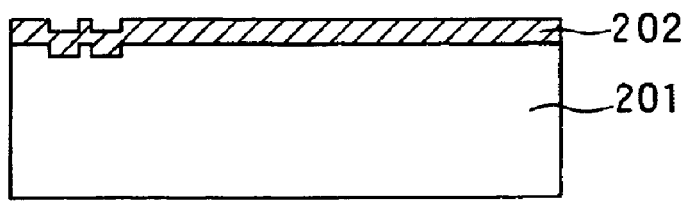
FIGS. 21A to 21D are schematic cross sectional views of a semiconductor substrate having a trench showing manufacturing steps of related art.
Figure 21B:
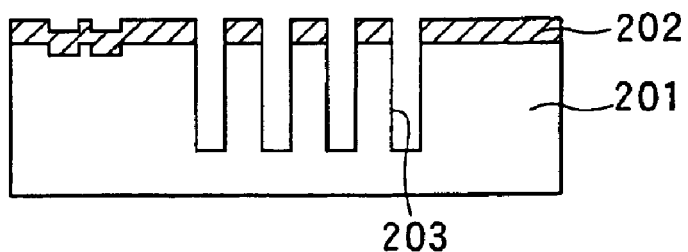
Figure 21C:
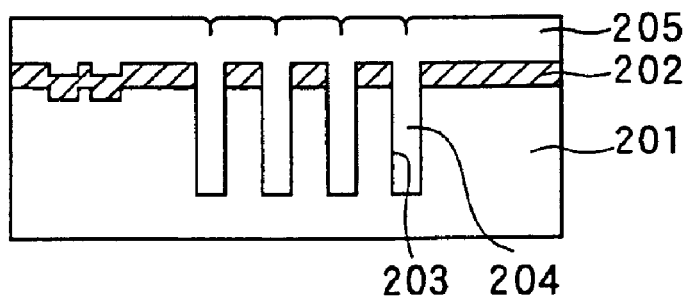

After that, similarly to the manufacturing method of the prototype, the trench 3 is filled with an epitaxial film doped with impurities by epitaxial growth (see FIG. 21C).

At this time, since the tip portion at the opening portion of the silicon oxide film 2 backs off the inner surface of the trench 3 in the lateral direction so as to expose a surface of the silicon substrate 1 in a neighborhood of an opening portion of the trench 3 (referred to as an edge portion of a trench), single crystal silicon is formed in the vicinity of the opening portion of the trench 3.

Therefore, crystallinity of the epitaxial film at the opening portion of the trench 3 is improved.

Moreover, a growth rate of single crystal silicon is slower than that of polycrystalline silicon. Thus, a growth rate of the epitaxial film at the opening portion becomes substantially the same as that of the epitaxial film in the trench 3. Therefore, generation of voids in filling the trench 3 is restrained.

Figure 21D:
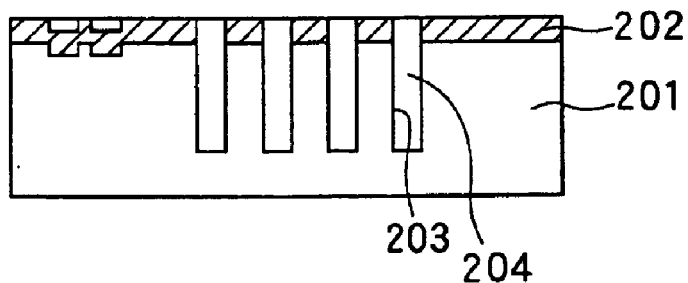
Figure 22A:
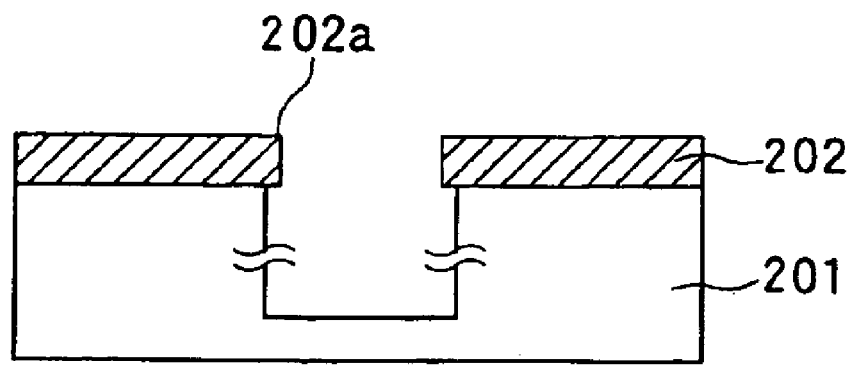
FIGS. 22A and 22B are schematic cross sectional views of a semiconductor substrate having a trench of related art.
Figure 22B:
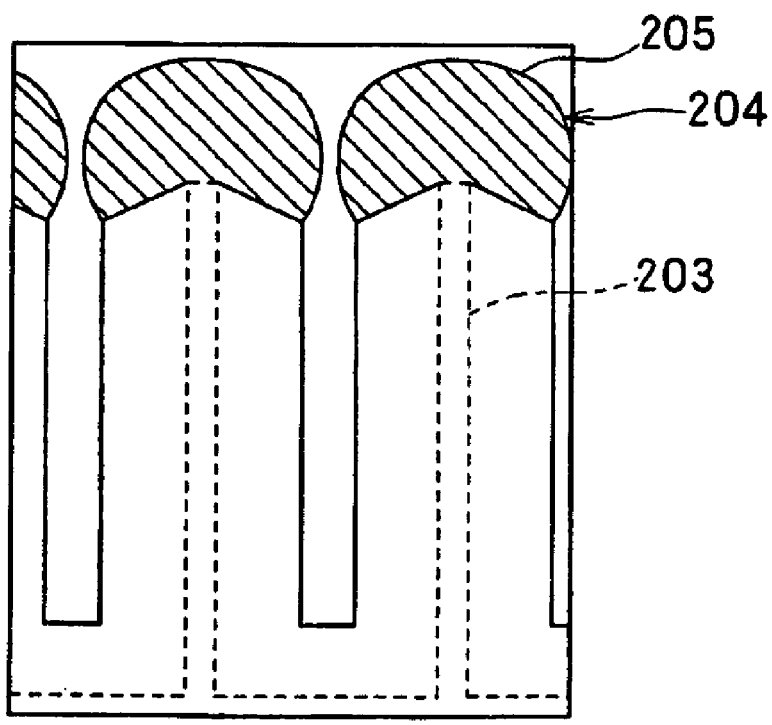

Then, polishing is performed by applying the silicon oxide film 2 as a stopper, so that a polycrystalline silicon layer is flattened (see FIG. 21D), whereby a semiconductor device having the trench 3 filled with diffusion layer is completed.

Second Embodiment

Second embodiment of the present invention will now be described hereinafter with reference to FIGS. 2A to 2E. These drawings show a manufacturing method of a semiconductor device in this embodiment.

Figure 2A:
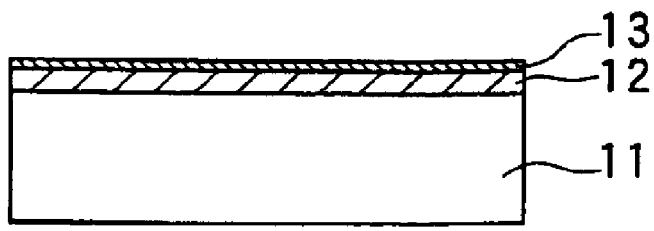
FIGS. 2A to 2E are schematic cross sectional views of a semiconductor substrate having a trench showing manufacturing steps of a second embodiment of the present invention.

[Step in FIG. 2A]

A silicon substrate 11 having a (1 1 0) face orientation is prepared. A thermal silicon oxide film having a thickness of about 425 Å is formed by oxidation on the silicon substrate 11. Subsequently, a silicon oxide film having a thickness of about 8000 Å is located on the thermal silicon oxide film by CVD, so that a silicon oxide film 12 is formed as a first mask. After that, an annealing treatment is performed in a nitrogen ($N_2$) atmosphere.

Subsequently, a silicon nitride film 13 served as a protection film is deposited on the silicon oxide film 12 to have a thickness of about 1500 Å. After that, an annealing treatment is performed in a nitrogen ($N_2$) atmosphere.

The silicon nitride film 13 protects the silicon oxide 12 so as not to reduce a thickness of the silicon oxide film 12 when an etching of protrusions of the silicon oxide film 12 is performed in a later step. Therefore, it is not necessary to make the silicon oxide film thicker, whereby camber of the silicon substrate 11 is restrained.

Figure 2B:
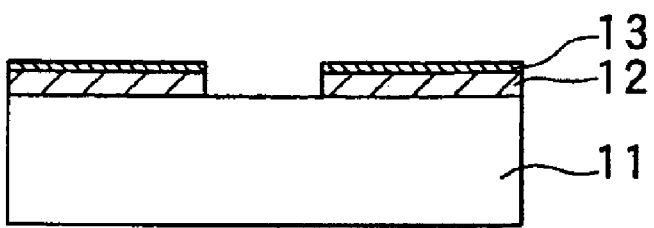

[Step in FIG. 2B]

The silicon oxide film 12 and the silicon nitride film 13 are patterned by dry etching, so that the silicon oxide film 12 and the silicon nitride film 13 are opened at a region where a trench 14 is to be formed.

Figure 2C:
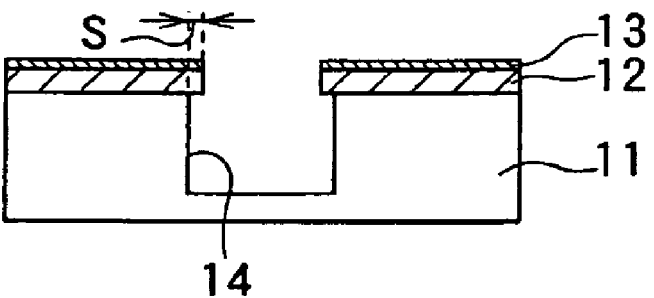

[Step in FIG. 2C]

The trench 14 is formed in the silicon substrate 11 at a depth of about 35 µm by etching using the silicon oxide film 12 and the silicon nitride film 13 as a mask. For example, wet etching having an etching rate at 1.4 µm/min is carried out for 25 minutes in 22 wt. % TMAH solution at 90° C.

As a result, the trench 14 is formed. In addition, an opening width of the trench 14 is widened in a lateral direction by the wet etching in comparison with an opening portion of the silicon oxide film 12 as the mask for etching, so that protrusions are formed in the silicon oxide film 12.

Similarly to the first embodiment, the protruding amount S in this embodiment becomes about 0.53 µm when the depth of the trench 14 is about 35 µm.

Figure 2D:
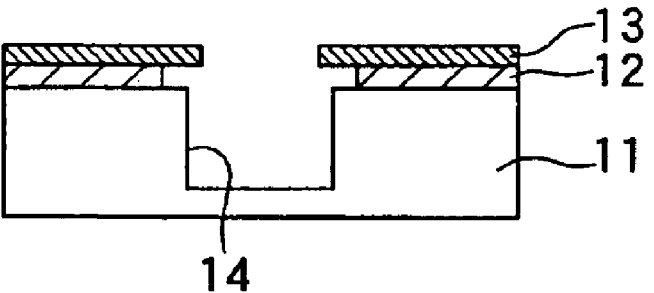

[Step in FIG. 2D]

The silicon oxide film 12 is etched by applying the silicon nitride film 13 as a mask. As a result, the etching is conducted so that a tip portion exposed at an opening of the silicon oxide film 12 is etched away sequentially. Therefore, the tip portion at the opening portion of the silicon oxide film 12 backs off an inner surface of the trench 14 in the lateral direction. In other words, an edge portion of the trench 14 is exposed.

For example, when the etching of the silicon oxide film 12 is conducted in hydrofluoric acid having a concentration of 1/50 with respect to water for 170 minutes, the tip portion at the opening portion of the silicon oxide film 2 backs off the inner surface of the trench 14 in the lateral direction at 0.4 µm.

Figure 2E:
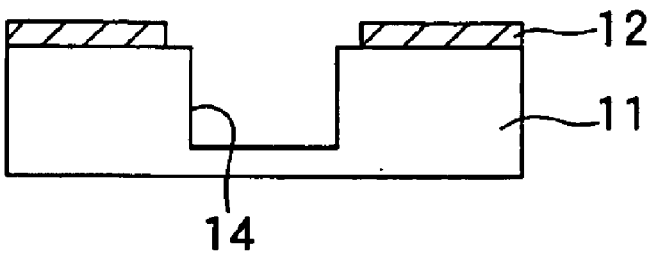

[Step in FIG. 2E]

The silicon nitride film 13 is etched away by phosphoric acid. As a result, the edge portion of the trench 14 is exposed.

Incidentally, the trench 14 is filled with an epitaxial film, then, polishing is performed as described in the first embodiment.

Similarly to the first embodiment, single crystal silicon is formed at a vicinity of an opening portion of the trench 14. Therefore, crystallinity of an epitaxial film at the opening portion of the trench 14 is improved. Consequently, voids are restrained from generating in the trench 14.

(Third Embodiment)

Third embodiment of the present invention will now be described hereinafter with reference to FIGS. 3A to 3F. These drawings show a manufacturing method of a semiconductor device in this embodiment.

Figure 3A:
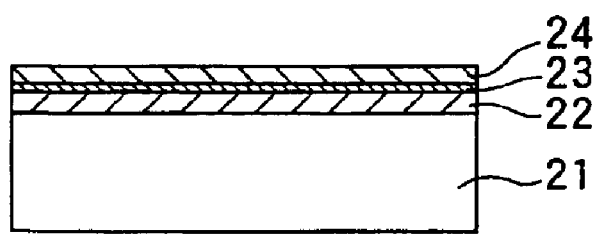
FIGS. 3A to 3F are schematic cross sectional views of a semiconductor substrate having a trench showing manufacturing steps of a third embodiment of the present invention.

[Step in FIG. 3A]

A silicon substrate 21 having a (1 1 0) face orientation is prepared. A thermal silicon oxide film having a thickness of about 425 Å is formed by oxidation on the silicon substrate 21. Subsequently, a silicon oxide film having a thickness of about 8000 Å is located on the thermal silicon oxide film by CVD, so that a silicon oxide film 22 is formed as a first mask.

Subsequently, a silicon nitride film 23 served as a protection film is deposited on the silicon oxide film 22 to have a thickness of about 1500 Å. Moreover, a silicon oxide 24 is deposited on the silicon nitride film 23 to have a thickness of about 10000 Å as a second mask. After that, an annealing treatment is performed in a nitrogen ($N_2$) atmosphere.

Figure 3B:
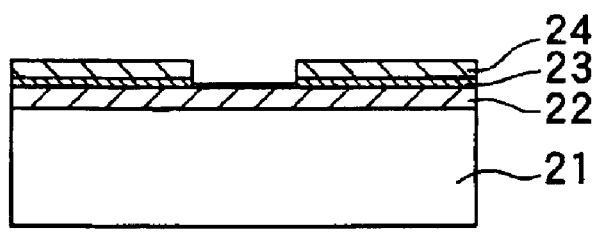

[Step in FIG. 3B]

The silicon oxide film 24 and the silicon nitride film 23 are patterned by dry etching, so that the silicon oxide film 24 is opened at a region where a trench 25 is to be formed, and so that the silicon nitride film 23 is etched partially in a thickness direction at a region where the trench 25 is to be formed so that a part of the silicon nitride film 23 remains.

Figure 3C:
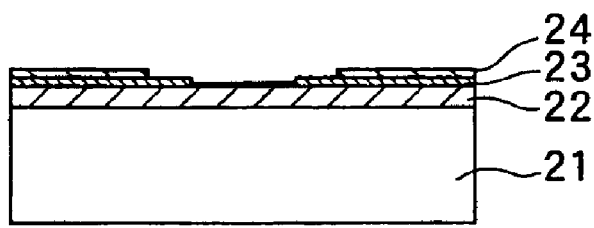

[Step in FIG. 3C]

The silicon oxide film 24 is etched so that an opening width of the silicon oxide film 24 is widened. For example, this etching is conducted in hydrofluoric acid having a concentration of 1/50 with respect to water for 180 minutes.

As a result, an opening portion of the silicon oxide film 22 is widened so that a portion of the silicon nitride film 23 located under the silicon oxide film 24 is exposed. Therefore, steps are formed at a portion where the silicon nitride film 23 is etched and at a portion where the silicon oxide film 24 is etched.

Figure 3D:
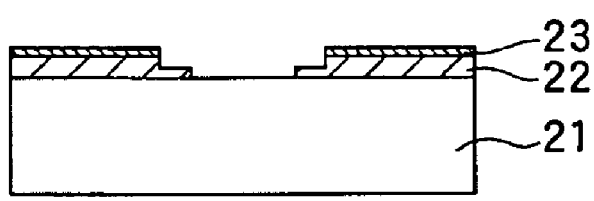

[Step in FIG. 3D]

The silicon oxide film 24, the silicon nitride film 23 and the silicon oxide film 22 are etched by dry etching.

In this step, the silicon oxide film 22 is opened at a portion where the trench 25 is to be formed, while the silicon nitride film 23 is opened wider than the silicon oxide film 22 because of the steps formed at the portion where the silicon nitride film 23 is etched and at the portion where the silicon oxide film 24 is etched.

Figure 3E:
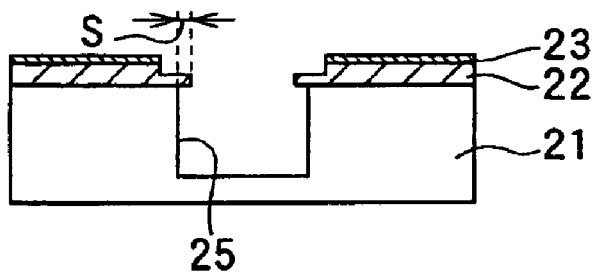

[Step in FIG. 3E]

The trench 25 is formed in the silicon substrate 21 to have a depth of about 35 µm by etching using the silicon oxide film 22 and the silicon nitride film 23 as a mask. For example, wet etching having an etching rate at 1.4 µm/min is carried out for 25 minutes in an etching solution of 22 wt. % TMAH solution at 90° C.

As a result, the trench 25 is formed. In addition, an opening width of the trench 25 is widened in a lateral direction by the wet etching in comparison with an opening portion of the silicon oxide film 22 served as the mask, so that protrusions are formed at an opening portion of the silicon oxide 22.

Similarly to the first embodiment, the protruding amount S in this embodiment becomes about 0.53 µm when the depth of the trench 25 is about 35 µm.

Figure 3F:
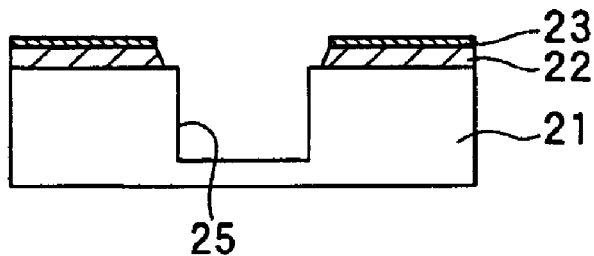

[Step in FIG. 3F]

The silicon oxide film 22 is etched by applying the silicon nitride film 23 as a mask. As a result, a tip portion at the opening portion of the silicon oxide 22 backs off an inner side surface of the trench 25 in the lateral direction in the vicinity of a tip portion of an opening portion of the silicon nitride film 23. Therefore, an opening width of the silicon oxide 22 becomes wider than that of the trench 25. In other words, an edge portion of the trench 25 is exposed.

For example, when the etching of the silicon oxide 22 is conducted in hydrofluoric acid having a concentration of 1/50 with respect to water for 180 minutes, the tip portion at the opening portion of the silicon oxide 22 backs off the inner side surface of the trench 25 at 0.37 µm in the lateral direction.

Then, similarly to the above-mentioned method, the trench 25 is filled with an epitaxial film doped with impurities (see FIG. 21C).

In this embodiment, similar to the above-described embodiment, single crystal silicon is formed at a vicinity of an opening portion of the trench 25. Therefore, crystallinity of an epitaxial film at the opening portion of the trench 25 is improved. Consequently, voids are restrained from generating in the trench 25.

Moreover, in the second embodiment, the silicon substrate 11 is exposed to the phosphoric acid to etch the silicon nitride film 13. On the other hand, in this embodiment, the silicon substrate 21 is not exposed to the phosphoric acid because it is not necessary to remove the silicon nitride film 23.

Then, a step of filling the trench 25 with an epitaxial film and a step of polishing the epitaxial film are similar to the first or the second embodiment. The silicon nitride film 23 is also served as the stopper with the silicon oxide film 22. Therefore, a stopper function is improved in polishing.

Fourth Embodiment

A fourth embodiment of the present invention will now be described hereinafter with reference to FIGS. 4A to 4D. These drawings show a manufacturing method of a semiconductor device in this embodiment.

Figure 4A:
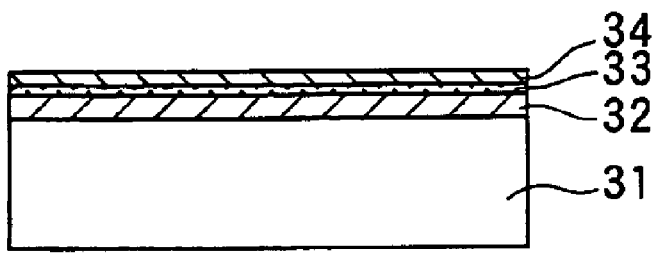
FIGS. 4A to 4D are schematic cross sectional views of a semiconductor substrate having a trench showing manufacturing steps of a fourth embodiment of the present invention.

[Step in FIG. 4A]

A silicon substrate 31 having a (1 1 0) face orientation is prepared. A thermal silicon oxide film having a thickness of about 425 Å is formed by oxidation on the silicon substrate 31. Subsequently, a silicon oxide film having a thickness of about 8000 Å is located on the thermal silicon oxide film by CVD, so that a silicon oxide film 32 is formed as a first mask.

Subsequently, a polycrystalline silicon film 33 as a protection film is deposited on the silicon oxide film 32 to have a thickness of about 1500 Å. Moreover, a silicon oxide film 34 as a second mask is deposited on the polycrystalline silicon film 33 to have a thickness of about 3000 Å. After that, an annealing treatment is performed in a nitrogen ($N_2$) atmosphere.

Figure 4B:
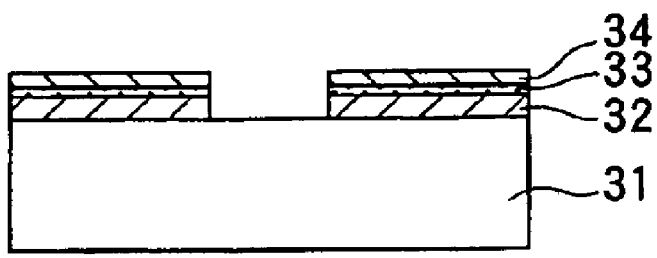

[Step in FIG. 4B]

The silicon oxide film 32, the polycrystalline silicon film 33 and the silicon oxide film 34 are patterned by dry etching, so that the silicon oxide film 32, the polycrystalline silicon film 33 and the silicon oxide film 34 are opened at a region where a trench 35 is to be formed.

Figure 4C:
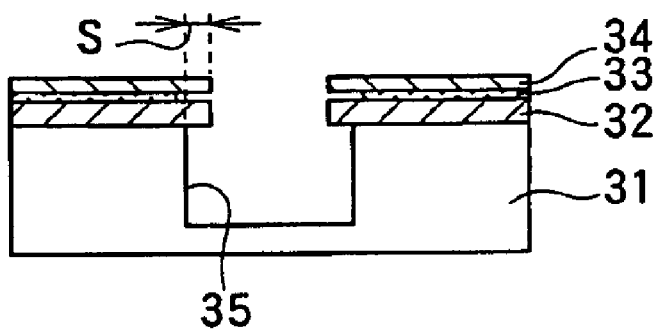

[Step in FIG. 4C]

The trench 35 is formed in the silicon substrate 31 to have a depth of about 35 µm by etching using the silicon oxide film 32, the polycrystalline silicon film 33 and the silicon oxide film 34 as a mask. For example, wet etching having an etching rate at 1.4 µm/min is carried out for 25 minutes in an etching solution of 22 wt. % TMAH solution at 90° C.

As a result, the trench 35 is formed. In addition, an opening width of the trench 35 is widened in a lateral direction by the wet etching in comparison with an opening portion of the silicon oxide film 32 served as the mask, so that protrusions are formed at opening portions in the silicon oxide films 32 and 34.

Similarly to the first embodiment, the protruding amount S in this embodiment becomes about 0.53 µm when the depth of the trench 35 is about 35 µm. Moreover, the polycrystalline silicon film 33 interposed between the silicon oxide films 32 and 34 is etched from an opening portion thereof, so that an opening width of the polycrystalline silicon film 33 becomes wider than that of the trench 35.

Figure 4D:
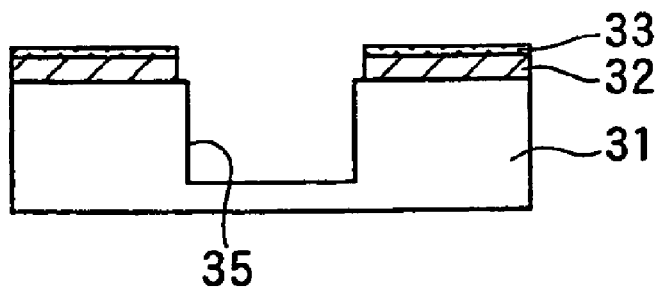

[Step in FIG. 4D]

The silicon oxide films 32 and 34 are etched by applying the polycrystalline silicon film 33 as a mask. As a result, the silicon oxide film 34 is removed, and a tip portion at the opening portion of the silicon oxide film 32 backs off an inner side surface of the trench 35 in the lateral direction in the vicinity of a tip portion of an opening portion of the polycrystalline silicon film 33. Therefore, an opening width of the silicon oxide film 32 becomes wider than that of the trench 35. In other words, an edge portion of the trench 35 is exposed.

For example, when the etching of the silicon oxide films 32 and 34 is conducted in hydrofluoric acid having a concentration of 1/50 with respect to water for 180 minutes, the tip portion at the opening portion of the silicon oxide film 32 backs off the inner side surface of the trench 35 at 0.4 µm in the lateral direction.

Then, similarly to the above-mentioned method, the trench 35 is filled with an epitaxial film doped with impurities (see FIG. 21C). After that, polishing of the epitaxial film is performed as described in the first embodiment.

In this embodiment, similar to the above-described embodiment, single crystal silicon is formed at a vicinity of an opening portion of the trench 35. Therefore, crystallinity of an epitaxial film at the opening portion of the trench 35 is improved. Consequently, voids are restrained from generating in the trench 35.

Moreover, in this embodiment, the silicon substrate 21 is not exposed to the phosphoric acid because it is not necessary to remove the polycrystalline silicon film 33.

In this embodiment, the silicon oxide film 32 is served as a stopper in polishing of the epitaxial film.

(Fifth Embodiment)

Fifth embodiment of the present invention will now be described hereinafter with reference to FIGS. 5A to 5F. These drawings show a manufacturing method of a semiconductor device in this embodiment.

Figure 5A:
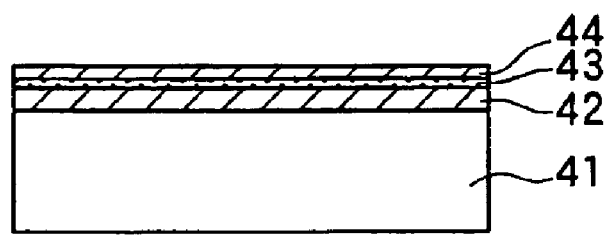
FIGS. 5A to 5F are schematic cross sectional views of a semiconductor substrate having a trench showing manufacturing steps of a fifth embodiment of the present invention.

[Step in FIG. 5A]

A silicon substrate 41 having a (1 1 0) face orientation is prepared. A thermal silicon oxide film having a thickness of about 425 Å is formed by oxidation on the silicon substrate 41. Subsequently, a deposited silicon oxide film having a thickness of about 8000 Å is located on the thermal silicon oxide film by CVD, so that a silicon oxide film 42 is formed as a first mask.

Subsequently, a polycrystalline silicon film 43 as a protection film is deposited on the silicon oxide film 42 to have a thickness of about 1500 Å. Moreover, a silicon oxide film 44 as a second mask is formed on the polycrystalline silicon film 43 to have a thickness of about 3000 Å by thermal oxidation of the polycrystalline silicon film 43 or by depositing a silicon oxide film. After that, an annealing treatment is performed in a nitrogen ($N_2$) atmosphere.

Figure 5B:
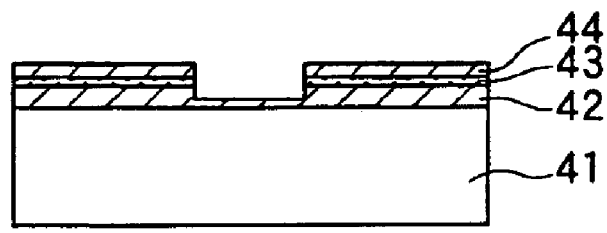

[Step in FIG. 5B]

The silicon oxide film 42, the polycrystalline silicon film 43 and the silicon oxide film 44 are patterned by dry etching, so that the silicon oxide film 44 and the polycrystalline silicon film 43 are opened at a region where a trench 45 is to be formed, and so that the silicon oxide film 42 is partially removed in a thickness direction at a region where the trench 45 is to be formed.

Figure 5C:
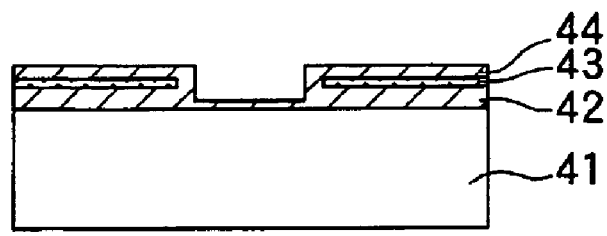

[Step in FIG. 5C]

An opening portion of the polycrystalline silicon film 43 is thermally oxidized by a thermal treatment. As a result, the opening portion of the polycrystalline silicon film 43 becomes wider.

Figure 5D:
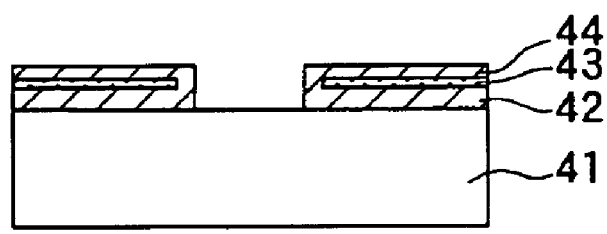

[Step in FIG. 5D]

The silicon oxide film 42 has been etched until the silicon substrate 41 is exposed by dry etching, so that the silicon oxide film 42 is opened at the region where the trench 45 is to be formed.

Figure 5E:
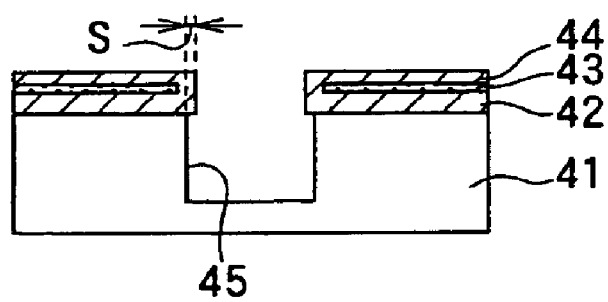

[Step in FIG. 5E]

The trench 45 is formed in the silicon substrate 41 to have a depth of about 35 µm by etching using the silicon oxide film 42, the polycrystalline silicon film 43 and the silicon oxide film 44 as a mask. For example, wet etching having an etching rate at 1.4 µm/min is carried out for 25 minutes in an etching solution of 22 wt. % TMAH solution at 90° C.

As a result, the trench 45 is formed. In addition, an opening width of the trench 45 is widened in a lateral direction by the wet etching in comparison with an opening portion of the silicon oxide film 42 served as the mask, so that protrusions are formed at opening portions of the silicon oxide films 42 and 44.

Similarly to the first embodiment, the protruding amount S in this embodiment becomes about 0.53 µm when the depth of the trench 45 is about 35 µm.

Figure 5F:
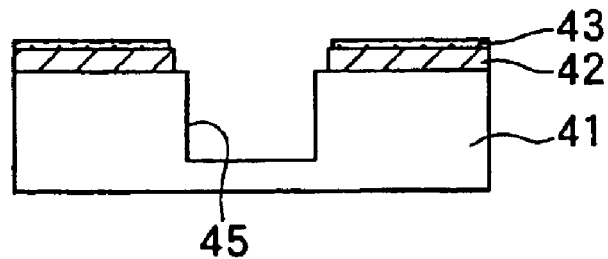

[Step in FIG. 5F]

The silicon oxide films 42 and 44 are etched, so that the silicon oxide film 44 is removed, and a tip portion at the opening portion of the silicon oxide film 42 backs off an inner side surface of the trench 45 in the lateral direction in the vicinity of a tip portion of an opening portion of the polycrystalline silicon film 43. Therefore, an opening width of the silicon oxide film 42 becomes wider than that of the trench 45. In other words, an edge portion of the trench 45 is exposed.

For example, when the etching of the silicon oxide films 42 and 44 is conducted in hydrofluoric acid having a concentration of 1/50 with respect to water for 180 minutes, the tip portion at the opening portion of the silicon oxide film 42 backs off the inner side surface of the trench 45 at 0.4 µm in the lateral direction.

Then, similarly to the above-mentioned method, the trench 45 is filled with an epitaxial film doped with impurities (see FIG. 21C). After that, polishing of the epitaxial film is performed as described in the first embodiment.

In this embodiment, as in the above-described embodiment, single crystal silicon is formed in the vicinity of an opening portion of the trench 45. Therefore, the crystallinity of an epitaxial film at the opening portion of the trench 45 is improved. Consequently, voids are restrained from generating in the trench 45.

Moreover, in this embodiment, the silicon substrate 41 is not exposed to the phosphoric acid because it is not necessary to remove the polycrystalline silicon film 43.

Sixth Embodiment

Sixth embodiment of the present invention will now be described hereinafter with reference to FIGS. 6A to 6E. These drawings show a manufacturing method of a semiconductor device in this embodiment.

[Step in FIG. 6A]

Silicon substrates 51 and 52 each having a (1 1 0) face orientation are prepared. Then, the substrates 51 and 52 are adhered each other with a buried silicon oxide film 53 located between them. Thus, a SOI substrate is formed. The buried silicon oxide film 53 corresponds to a first mask, and the silicon substrate 52 corresponds to a protection film.

Next, the silicon substrate 52 is thinned by polishing or the like so as to form a SOI layer. The thinned silicon substrate 52 is referred to as the SOI layer hereinafter.

Incidentally, the silicon substrate constituting the SOI layer 52 has a (1 1 0) face orientation. This is because this silicon substrate is etched controllably by TMAH solution so that an etching amount of the SOI layer 52 is adjusted controllably.

[Step in FIG. 6B]

Subsequently, a surface of the SOI layer is thermally oxidized. As a result, the SOI layer 52 remains between the buried silicon oxide film 53 and a silicon oxide film 54 served as a second mask.

[Step in FIG. 6C]

The silicon oxide film 54, the SOI layer 52 and the buried silicon oxide film 53 are patterned by dry etching, so that the silicon oxide film 54, the SOI layer 52 and the buried silicon oxide film 53 are opened at a region where a trench is to be formed.

[Step in FIG. 6D]

A trench 55 is formed in the silicon substrate 31 at a depth of about 35 µm by etching using the silicon oxide film 54, the SOI layer 52 and the buried silicon oxide film 53 as a mask. For example, wet etching having an etching rate at 1.4 µm/min is carried out for 25 minutes in an etching solution of 22 wt. % TMAH solution at 90° C.

As a result, the trench 55 is formed. In addition, an opening width of the trench 55 is widened in a lateral direction by the wet etching in comparison with an opening portion of the buried silicon oxide film 53 served as the mask, so that protrusions are formed at an opening portions of the buried silicon oxide film 53 and silicon oxide film 54.

Similarly to the first embodiment, the protruding amount S in this embodiment becomes about 0.53 µm when the depth of the trench 35 is about 35 µm. Moreover, the SOI layer 52 interposed between the silicon oxide films 53 and 54 is etched from an opening portion thereof.

[Step in FIG. 6E]

The silicon oxide films 54 and 53 are etched. As a result, the silicon oxide film 54 is removed, and the buried silicon oxide film 53 is etched from a tip portion at an opening portion thereof, so that an opening width of the buried silicon oxide film 53 becomes wider than that of the trench 55. For example, when the etching of the silicon oxide films 54 and 53 is conducted in hydrofluoric acid having a concentration of 1/50 with respect to water for 180 minutes, the tip portion at the opening portion of the silicon oxide film 53 backs off the inner side surface of the trench 55 in the lateral direction at 0.4 µm.

Then, similarly to the above-mentioned method, the trench 55 is filled with an epitaxial film doped with impurities (see FIG. 21C). After that, polishing of the epitaxial film is performed as described in the first embodiment.

In this embodiment, similar to the above-described embodiment, single crystal silicon is formed in the vicinity of an opening portion of the trench 55. Therefore, the crystallinity of an epitaxial film at the opening portion of the trench 55 is improved. Consequently, voids are restrained from generating in the trench 55.

In this embodiment, the buried silicon oxide film 53 serves as a stopper in polishing of the epitaxial film.

In the above-mentioned embodiments, although the depth of the trenches is 35 µm as one of example, the depth of the trench can be selected based on a device formed in a silicon substrate. Therefore, the manufacturing method of the above-mentioned embodiments can be applied to a substrate in which a trench having any depth is formed.

For example, in the first embodiment, a relationship between the depth of the trench and the protruding amount is shown in a table in FIG. 7. As shown in this table, the protruding amount becomes larger with increase of the depth of the trench. Therefore, an etching amount of a silicon oxide film served as a mask when the silicon oxide film is backed off can be selected based on the protruding amount of the silicon oxide film.

Moreover, in the above-mentioned embodiments, although the epitaxial growths are performed in the condition that the silicon oxide films 2, 12, 22, 32, 42, 53 remain, these silicon oxide films can be removed entirely before the epitaxial growth.

However, in that case, since the stopper in polishing the epitaxial film does not remain, a thickness of the epitaxial film should be controlled by adjusting a polishing time of flattening.

Incidentally, when a plural trenches are formed, an etching amount of the silicon oxide film to be backed off is selected based on an interval between an adjacent two of the plural trenches. Moreover, the case is acceptable that the silicon oxide film is removed between the trenches while the silicon oxide film remains on a region of the silicon substrate where the trenches are not formed.

Incidentally, in the third embodiment, although the step shown in FIG. 3D is formed in the manufacturing step that the silicon nitride film 23 is etched partially after the silicon oxide film 24 is formed on the silicon nitride film 23, the step is also formed by use of two masks having different opening widths with each other.

In the above-mentioned embodiments, although the crystallinity in the vicinity of the opening portion of the trench is mainly described, in embodiments explained below, an improvement of the crystallinity inside the trench will be also described.

Seventh Embodiment

A seventh embodiment will be described with reference to FIGS. 8A to 8B, 9 through 14. These figures are schematic cross sectional views showing a manufacturing method of a semiconductor substrate.

Figure 9:
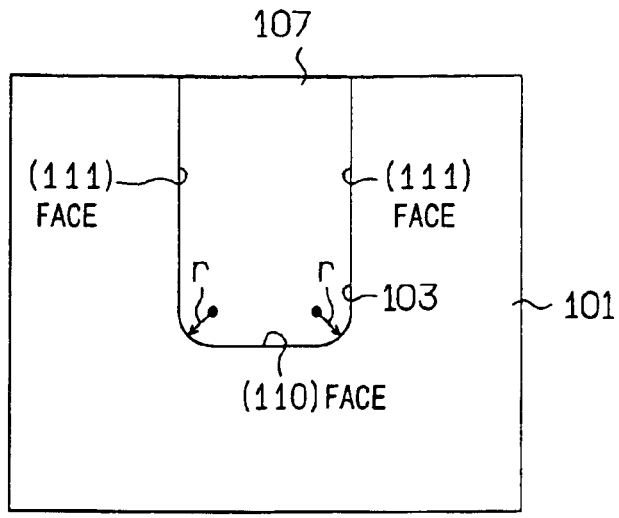
FIG. 9 is a schematic cross sectional view of the semiconductor substrate after a trench is filled with an epitaxial film in a seventh embodiment.

Referring to FIG. 9, a trench 103 is formed in a silicon substrate (single crystal silicon substrate) 101 constituting a semiconductor substrate. The trench 103 is filled with a single crystal silicon film 107. The single crystal silicon film 107 is deposited by epitaxial growth. Incidentally, the silicon substrate 101 is an n-type silicon substrate, and the single crystal silicon film 107 is a p-type diffusion layer. Therefore, a pn junction is formed at the interface between the substrate 101 and the diffusion layer 107, and large semiconductor integration is achieved in the depth direction. Incidentally, the conduction types of the substrate 101 and the diffusion layer 107 may be inverted (the substrate 101 may be p-type and the diffusion layer 107 may be n-type). Moreover, the diffusion layer 107 is formed by a buried epitaxial layer so that the concentration of the dopant of the buried epitaxial layer is controlled by the epitaxial growth. As a result, the diffusion layer 107 has a uniform concentration profile in the depth direction and in the lateral direction.

Next, a manufacturing method of the semiconductor substrate will be described as follows.

Figure 8A:
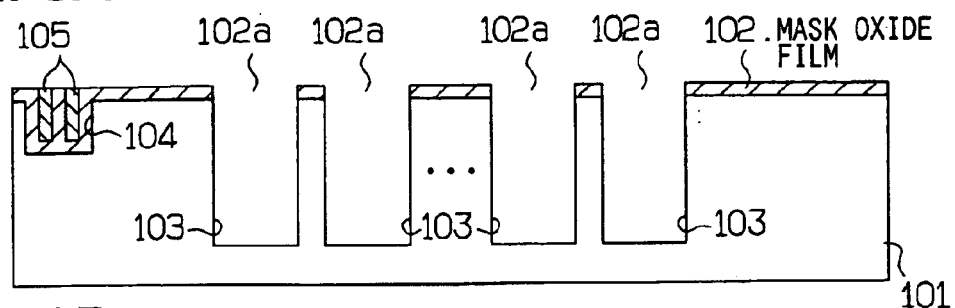
FIGS. 8A to 8D are schematic cross sectional views of a semiconductor substrate having a trench showing manufacturing steps of a seventh embodiment of the present invention.

As shown in FIG. 8A, the single crystal silicon substrate 101 is prepared. The substrate 101 has a surface oriented to a (1 1 0) face. A mask oxide film (silicon oxide film) 102 as a mask for trench etching is formed on an upper surface of the substrate 101. After a photo resist is deposited on the mask oxide film 102, opening portions 102a are formed on predetermined regions of the mask oxide film 102 by photolithography. In other words, the regions where trenches are to be formed are exposed. Although this oxide film etching may be either dry etching or wet etching, dry etching is preferred for improved manufacturing precision.

Subsequently, trenches 103 are formed in the substrate 101 by etching with the silicon oxide film 102 as the mask. Namely, the trenches 103 are formed by anisotropic dry etching through the opening portions 102a. RIE (Reactive Ion Etching) method is used for the dry etching, which is utilized in a semiconductor process generally.

Regarding the trench forming process described above, although anisotropic dry etching is used, anisotropic wet etching may be used. If wet etching is carried out for forming the trenches 103, a natural oxide film formed on the surface of the substrate 101 at the opening portions 102a of the oxide film 102 is removed by HF solution or the like. Then, the trench etching is performed with TMAH solution. In the anisotropic etching by the TMAH solution, the etching rate of the substrate 101 depends on the face orientation of the substrate 101. Therefore, a trench forming process having a higher aspect ratio is achieved when the substrate has a Si (1 1 0) orientation and when the side face of the trench has a Si (1 1 1) face because the etching selectivity of a Si (1 1 1) face with respect to a Si (1 1 0) face is 1:60. Incidentally, a KOH solution may be used in place of the TMAH solution as the etching solution.

In the trench etching process, the inner surface (the side faces and the bottom face) of the trench is vulnerable to roughening and crystal defects. In particular, when the trench is formed in a substrate having a surface orientation of Si (1 1 0) by TMAH solution etching, the roughness is relatively high on the bottom face (Si (1 1 0) face) in comparison with the side face (Si (1 1 1) face). When the inner face (the side faces and the bottom face) of the trench is roughened, crystal defects occur in the epitaxial growth layer that follows the trench etching.

Incidentally, in or before the trench etching, an alignment trench 104 for aligning masks is formed and filled with a polycrystalline silicon or the like which has a high tolerance to HF solution. The alignment trench 104 can be used for detecting the finishing time of a polishing process described below.

Figure 8B:
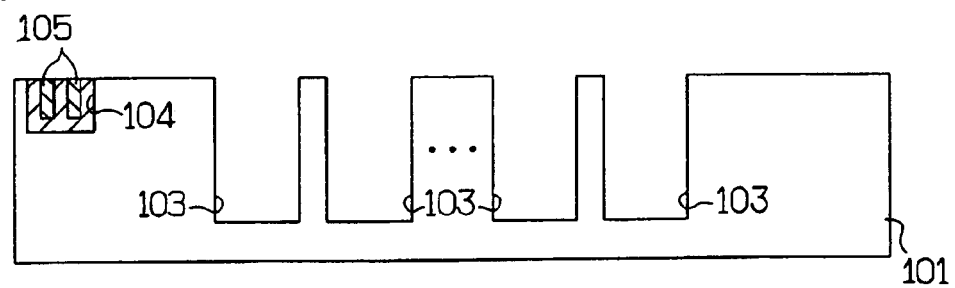

Subsequently, as shown in FIG. 8B, the oxide film 102 used as the mask is entirely removed from the surface of the substrate 101. Like this, by entirely removing of the oxide film 102, the oxide film 102 is prevented from peeling off during a thermal treatment as a following process. At this time, if cleaning of the substrate 101 with HF solution is performed, a natural oxide film inside the trench is also removed. Especially, when the trench forming process is conducted by the dry etching, reaction products may adhere inside the trench. Therefore, in this cleaning of the substrate 101 with HF solution, it is preferable that the substrate 101 is cleaned first by sulfuric acid (H2SO4) solution mixed with hydrogen peroxide (H2O2) solution before the HF cleaning. The removal of the mask oxide film 102 also can be performed by the cleaning with the HF solution, and so, FIG. 8B shows this way. Like this, in the case that the cleaning of the natural oxide film and the by-products by the reaction is conducted before the epitaxial growth, adverse effects in the epitaxial growth caused by existence of the natural oxide film and the reaction products can be avoided.

After that, the inner face (the side face and the bottom face) of the trench in the substrate 101 is made smooth by the thermal treatment. This thermal treatment is conducted under low pressure, and in a non-oxidizing or in a non-nitriding atmosphere at 900 to 1200° C. for several minutes to several tens of minutes, for example, although the time is depends on degree of the roughness. It is preferable that this thermal treatment is performed at 1100° C. or more.

The non-oxidizing and non-nitriding atmosphere is obtained by introducing hydrogen gas or rare gas into a chamber under low pressure. When the thermal treatment for smoothing the inner face of the trench is conducted in a LP-CVD chamber which is used in the epitaxial growth, the process can be simplified and a formation of the natural oxide film is prevented (it is not necessary to remove the natural oxide film). In other words, when the thermal treatment and the epitaxial growth of an epitaxial film 106 are conducted in the same apparatus successively, adhesion of contaminants is restrained, and improvement of throughput is expected.

Figure 8C:
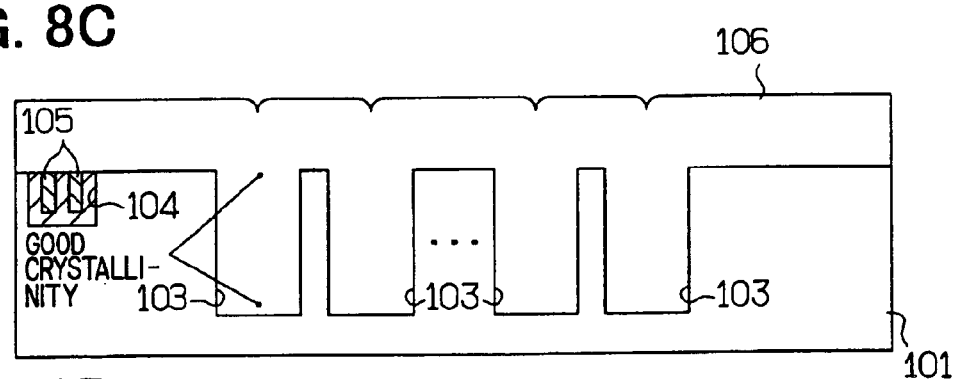

After that, as shown in FIG. 8C, the epitaxial growth is conducted, in which the epitaxial film 106 is formed to fill the trench and to be located on the surface of the substrate 101. In detail, the epitaxial film 106 is formed in the LP-CVD chamber under low pressure at 800 to 1100° C. In this manner, the trenches 3 are filled with the epitaxial film 106. In the formation of the epitaxial film 106, the substrate 101 is kept at a predetermined temperature in a state where the surface of the substrate 101 is exposed to a film-forming gas including at least an element of a film-forming material of the epitaxial film 106. Then, the film-forming gas and a dopant-containing gas are introduced into the chamber of a non-oxidation atmosphere under low pressure to form the diffusion layer, which is different from the substrate 101 in one of concentration and conductive type, in the trenches. In this manner, the conductive type and concentration of the diffusion layer (epitaxial layer) can be controlled, so that the diffusion layer is formed in the desired manner. Furthermore, the diffusion layer may be formed by plural layers having different concentrations or different conductive types.

That is, the epitaxial film may be composed of epitaxial layers having different conductive types. For example, a first n-type layer, a p-type layer and a second n-type layer are laminated alternately.

Then, after the buried epitaxial film is formed, a surface of the epitaxial film 106 located on the substrate 101 is flattened, so that steps generated on the trenches 3 are eliminated. In this flattening process, CMP (Chemical Mechanical Polish) can be used. By the CMP, a part of the epitaxial film having inferior crystallinity in the vicinity of the opening portion of the trench can be removed simultaneously with the flattening of the epitaxial film. Incidentally, etch back method by dry etching or anisotropic wet etching may substitute for the CMP (polishing). The flattening process may be conducted by a combination of the polishing, the etch back and the anisotropic wet etching.

In the substrate processed through above-described processes, as shown in FIG. 9, the trench 103 opened at the upper surface of the substrate is formed, and the trench 103 is filled with the single crystal silicon 107. Moreover, a radius of curvature r at a corner formed by the side face and the bottom face of the trench 103 is provided at 1.0 μm or more. Furthermore, a maximum height $R_{max}$ in the roughness of the inner face of the trench 103 is 3 nm or less. More preferably, the radius of curvature r at the corner is 1.5 μm or more, and the maximum height $R_{max}$ of the roughness in the inner face of the trench 103 is 2 nm or less.

Figure 8D:
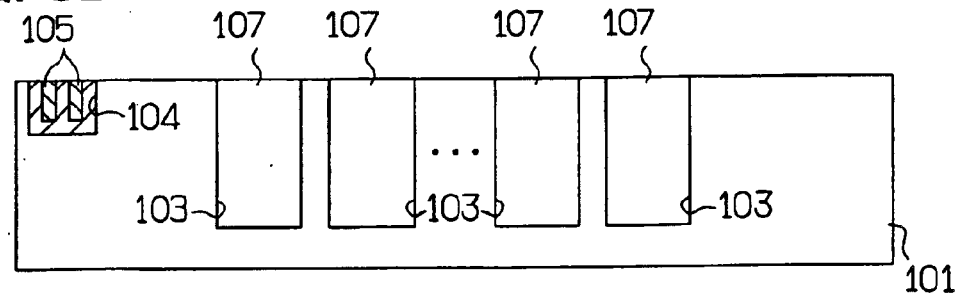

Unlike a diffusion layer formed by thermal diffusion or the like from a surface of a substrate, the diffusion layer (the diffusion layer extending in the depth direction of the substrate) 107 formed through the above-mentioned processes has a high aspect ratio as shown in FIG. 8D.

Therefore, the substrate described in this embodiment can be used for forming a MOS device capable of withstanding high voltage, which is disclosed in U.S. Pat. No. 5,438,215.

Incidentally, in the polishing process for flattening, since an oxide film is not formed especially as a stopper of the polishing, the stop time of the polishing is. determined by the thickness of the remaining epitaxial film on the substrate (it is able to detect by an exposure of the alignment trench.)

As described above, the epitaxial growth is conducted after the inner surface of the trench is smoothed by the thermal treatment under the low pressure atmosphere (non-oxidizing and non-nitriding). In detail, the thermal treatment in the non-oxidizing or non-nitriding atmosphere and the epitaxial growth are conducted successively in the LP-CVD chamber for conducting the epitaxial growth. At that time, the mask oxide film 102 shown in FIG. 8A is removed as shown in FIG. 8B for preventing separation of the mask oxide film 102 in the thermal treatment.

In this manner, the roughness on the inner surface of the trench is reduced by the non-oxidizing or non-nitrding thermal treatment so that crystallinity of the epitaxial film is improved. In detail, although the roughness on the inner surface (actually, the maximum height Rmax) becomes large after the trench etching is conducted by TMAH solution, the non-oxidizing or non-nitrding thermal treatment makes the Rmax small. The reduction of the Rmax depends on the time of the thermal treatment. Moreover, oxidation and nitridation is prevented by forming hydrogen atmosphere.

Figure 10:
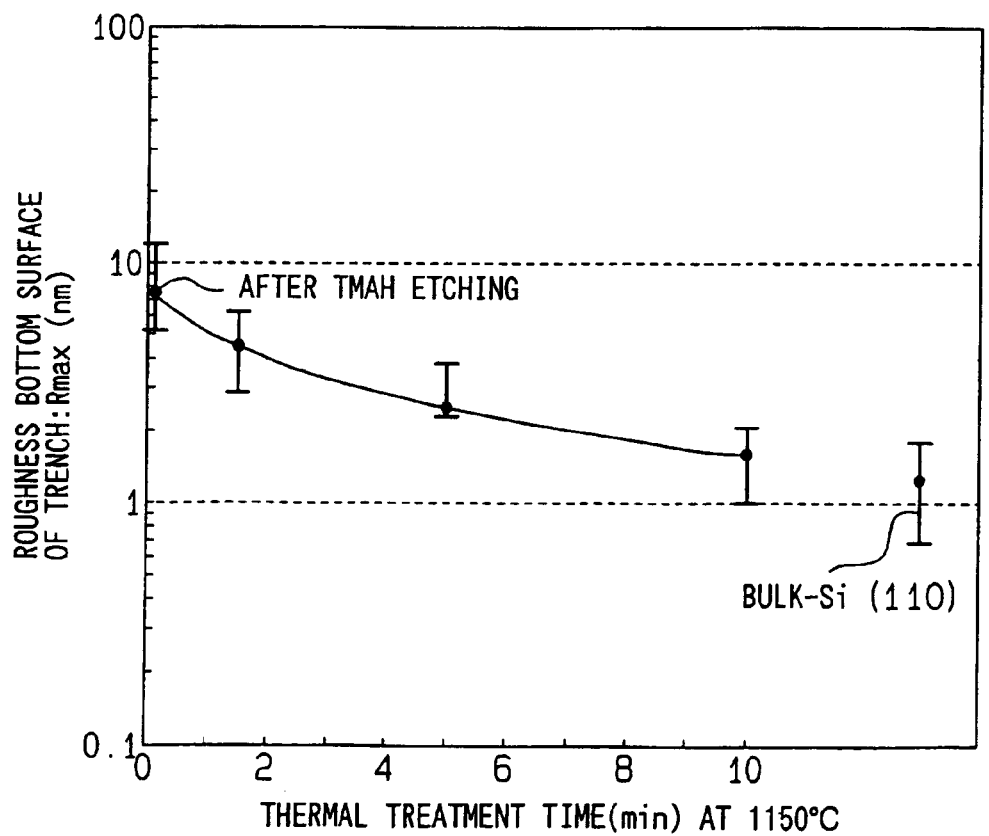
FIG. 10 is a graph showing a relationship between roughness on a bottom surface of the trench and thermal treatment time at 1150° C.

FIG. 10 shows a change of the roughness by performing the thermal treatment. The X-axis indicates the treatment time, and the Y-axis indicates the roughness on the bottom surface of the trench. Incidentally, the roughness on a surface of bulk silicon having a surface orientation of (1 1 0) is also shown in FIG. 10 as a reference value. The temperature of the treatment was at 1150° C. Surface roughness was measured at five points on the same surface in each sample by a step measurement apparatus. Referring to FIG. 10, the roughness on the bottom surface of the trench is reduced by the thermal treatment.

Next, a trade-off between the improvement of the crystallinity and the peeling (separation) of the mask will be described.

Figure 11:
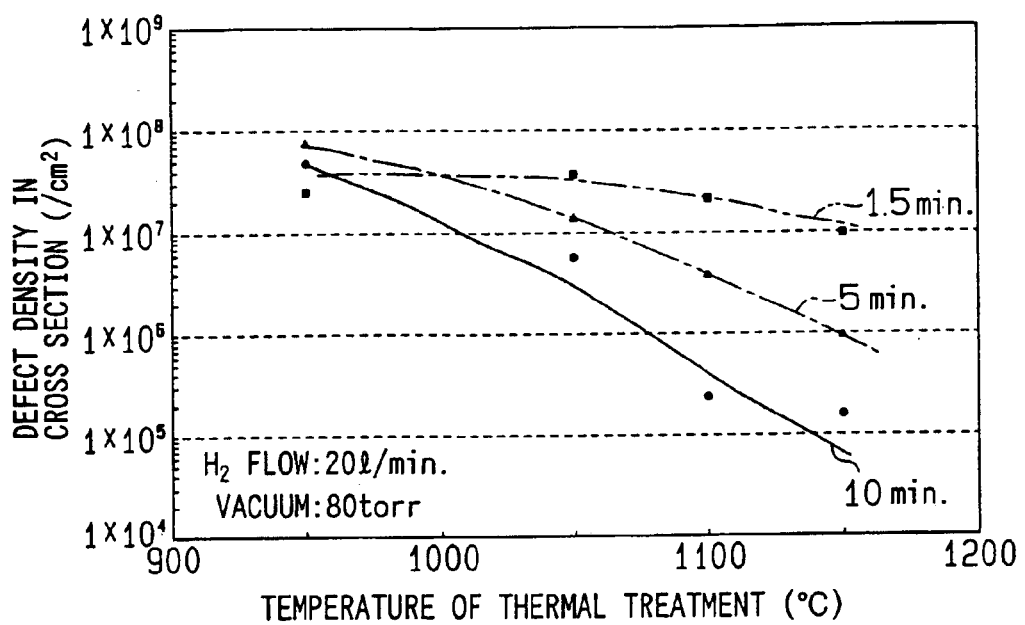
FIG. 11 is a graph showing a relationship between defect density in cross section and temperature of thermal treatment.

FIG. 11 shows experimental data regarding the improvement of the crystallinity by the non-oxidizing and the non-nitriding thermal treatment. In other words, a change of the crystallinity in the epitaxial film occurs when the non-oxidizing and the non-nitriding thermal treatment is performed.

The X-axis shows temperature of the treatment. The Y-axis shows defect density in a cross section after the epitaxial film is formed (after seco-etching is conducted, i.e., after etching with a mixed solution of hydrofluoric acid and potassium dichromate is conducted). The hydrogen ($H_2$) flow rate is set to 20 liters per minute. The degree of vacuum is set to 80 torr. The experiment is conducted in three time periods, i.e., 1.5 min, 5 min, and 10 min. The effect of the thermal treatment for decreasing crystal defects gradually appears at 950° C. or more, and the effect is prominent when the treatment is performed at 1100° C. or more and for ten minutes or more.

Figure 12:
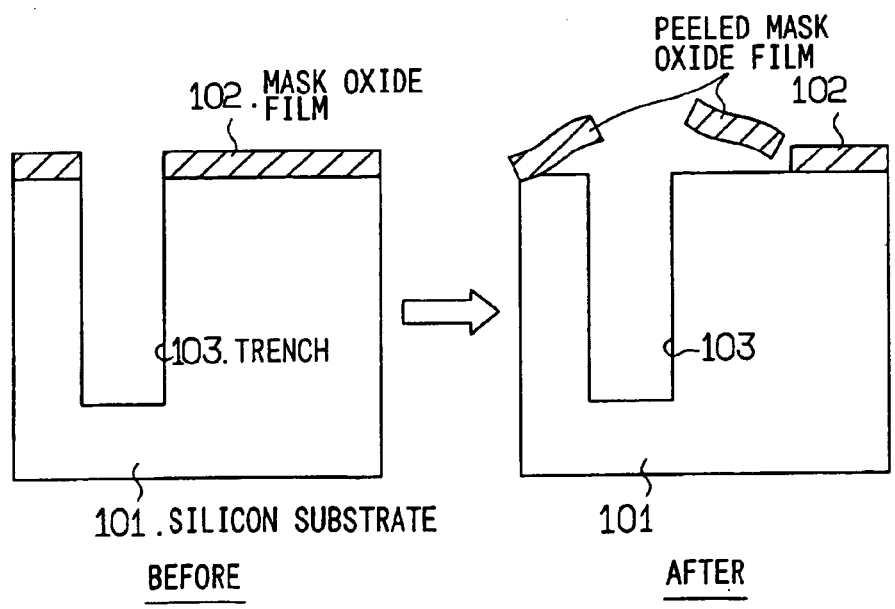
FIG. 12 is a schematic cross sectional view of a semiconductor substrate having a trench before and after thermal treatment is conducted.
Figure 13:
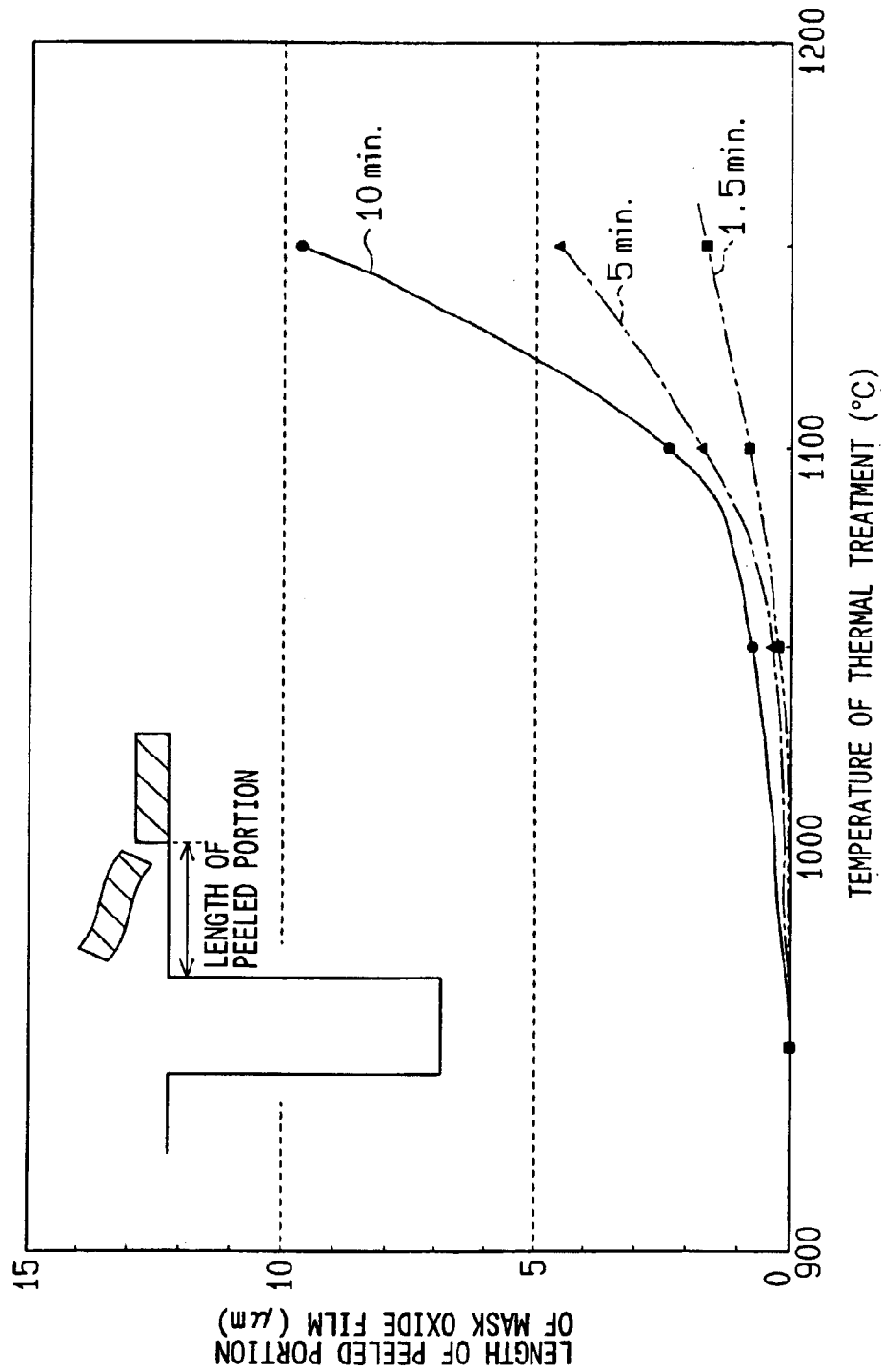
FIG. 13 is a graph showing a relationship between length of peeled portion of mask oxide film and temperature of thermal treatment.

Incidentally, as shown in FIG. 12, the oxide film can peel off at an edge of the trench by the thermal treatment. As described in the first embodiment, this is because the oxide film as the mask for forming the trench is left with the eaves protruding from the edge of the trench, which results in the peeling of the oxide film. The peeling of the oxide film is quantified by measurement. A result of the measurement is shown in FIG. 13. In other words, FIG. 13 shows size of the peeled oxide film portion caused by various conditions of the non-oxidizing and the non-nitriding thermal treatments. The X-axis indicates temperature in the treatment, and the Y-axis indicates length of the peeled oxide film portion. The times of the treatments were set at 1.5 min, 5 min, and 10 min.

When the treatment is performed at 1150° C. for 10 minutes, the crystallinity of the epitaxial film is improved efficiently, and the length of the peeled oxide film is about 10 μm as understood from FIG. 13. The peeled oxide film should be cleared because it becomes particle contamination and causes deterioration of the crystallinity of the epitaxial film formed after the thermal treatment is performed.

Figure 14A:
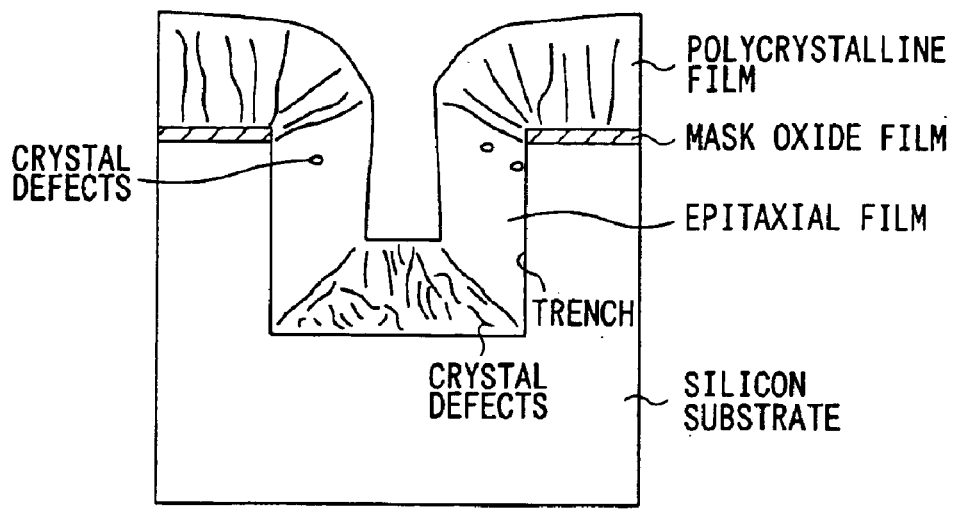
FIGS. 14A to 14C are schematic cross sectional views of a semiconductor substrate having a trench based on SEM images.
Figure 14B:
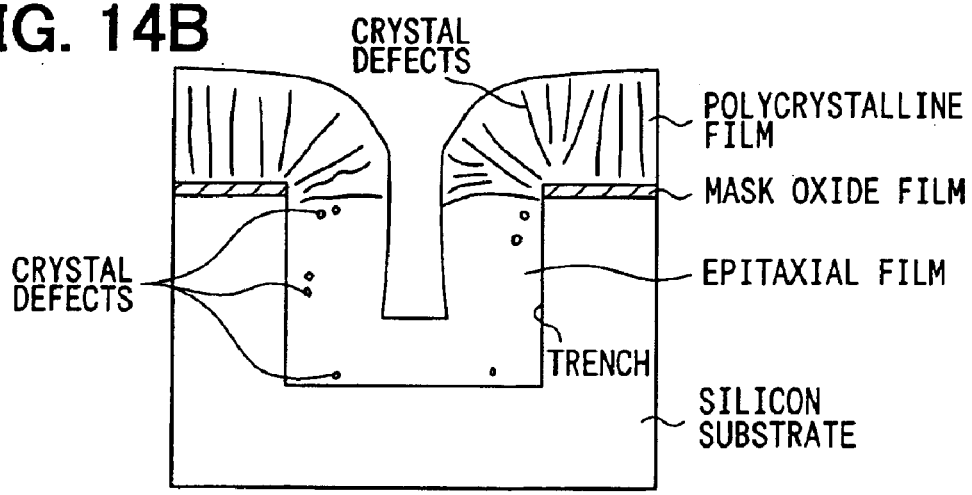
Figure 14C:
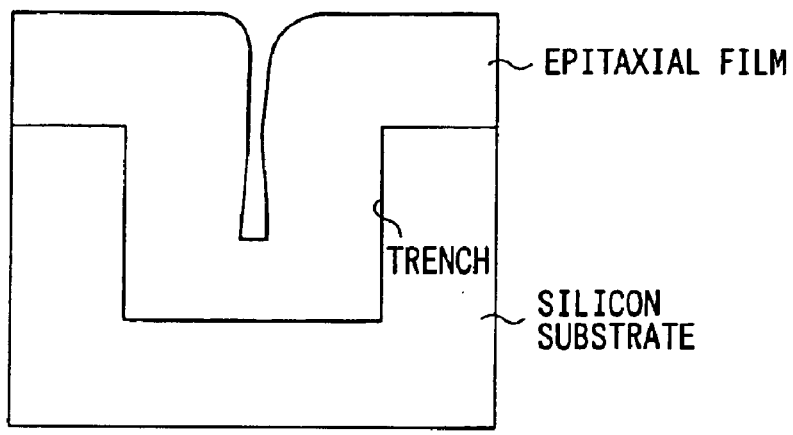

FIGS. 14A to 14C are cross sectional views of a semiconductor substrate having a trench to show an effect of the non-oxidizing and the non-nitriding thermal treatment. In detail, FIGS. 14A to 14C show SEM images after cross sectional stain etchings by use of mixed solution composed by hydrofluoric acid and nitric acid are performed.

FIG. 14A shows a case that trench burring epitaxial growth is conducted without the thermal treatment while the mask oxide film having a thickness of 500 nm is left. In this case, crystal defects are generated on a bottom surface of the trench, and pits appear at an opening portion of the trench. Moreover, polycrystalline silicon grows on the mask oxide film.

FIG. 14B shows a case that a trench burring epitaxial growth is conducted after the thermal treatment is performed at 1150° C. for 10 minutes while the mask oxide film having a thickness of 500 nm is left. In this case, although the crystallinity is improved on the bottom surface of the trench relatively, the etch pits caused by the thermal treatment appear. The pits also appear at the opening portion of the trench.

FIG. 14C show a case that the trench burring epitaxial growth is conducted after the thermal treatment is performed at 1150° C. for 10 minutes without the mask oxide film having the thickness of 500 nm. In this case, the crystallinities in a bottom portion of the trench and in an opening portion of the trench are improved. Moreover, epitaxial film grows outside the trench.

Incidentally, in this embodiment, although the mask oxide film is removed entirely before the non-oxidizing and the non-nitriding thermal treatment for reducing the roughness on the inner surface of the trench, the mask oxide film is removed partially so that the protrusion backs off the opening portion of the trench like the above-mentioned embodiments.

In this case, the same effect is also obtained as understood from FIG. 13.

Hereinafter, the effect of the single crystal semiconductor layer (diffusion layer) filling the trench 103 will be described.

Figure 23:
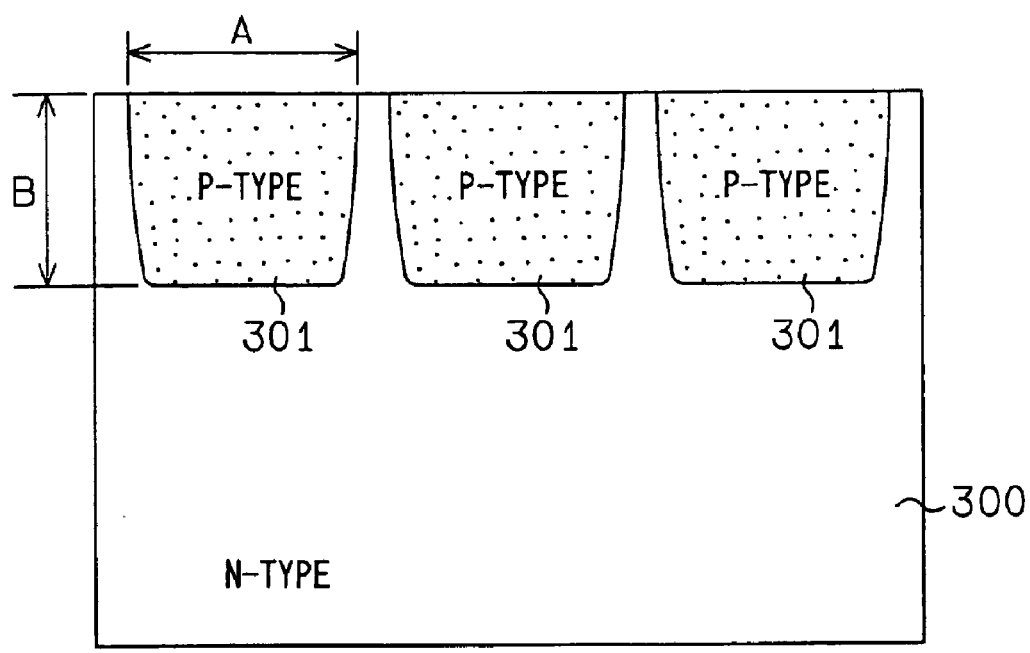
FIG. 23 is a schematic cross sectional view of a semiconductor substrate having impurity diffusion regions of related art.

As shown in FIG. 23, a silicon substrate 301 having a diffusion layer 301 in which impurity concentration is arranged uniformly in a depth direction is known to be effective to a reduction of on resistance of a MOS device capable of withstanding high voltage that is disclosed in, for example, U.S. Pat. No. 5,438,215. Moreover, it is also available by another reason that semiconductor devices are formed integrally in a depth direction by using the substrate in the depth direction sufficiently.

A thermal diffusion of dopant impurities, which is used in a general silicon semiconductor process as a conventional method, and an ion implantation and a subsequent diffusion process are usually used for forming the diffusion layer 301. However, since the depth B of the diffusion layer 301 is determined by the diffusion velocity of the dopant impurities, the diffusion layer 301 is formed at a depth of several micrometers from the surface of the substrate at most. In addition, the dopant impurities diffuse in a lateral direction as well as in the depth direction because they diffuse isotropically. As a result, the diffusion layer has a width A that is substantially the same as the depth thereof. Therefore, the aspect ratio, which is equal to B/A, does not become larger than one, in theory, when the diffusion layer is formed by the conventional method, in which the structure of semiconductor devices is restricted.

Figure 24A:
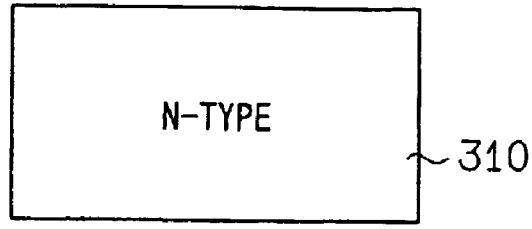
FIGS. 24A to 24C are schematic cross sectional views of a semiconductor substrate showing manufacturing steps of prior art;.
Figure 24B:
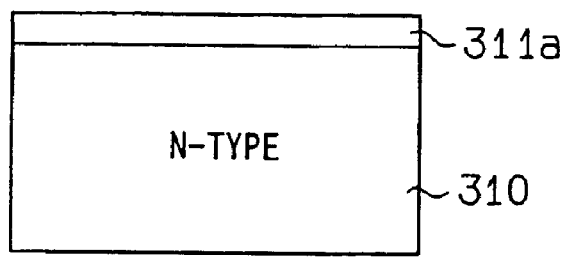
Figure 24C:
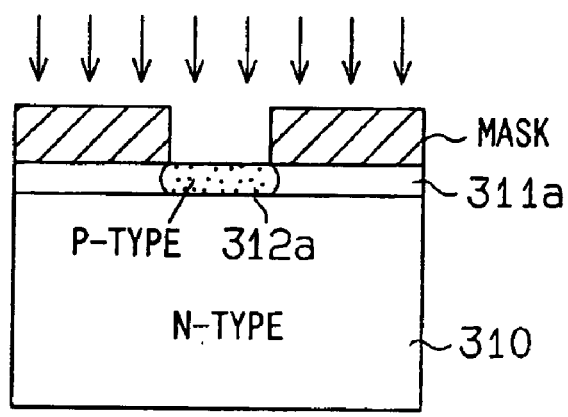
Figure 25A:
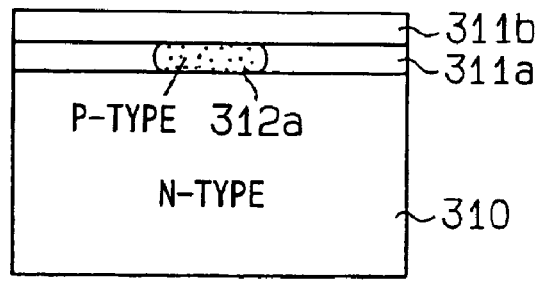
FIGS. 25A to 25C are schematic cross sectional views of a semiconductor substrate showing manufacturing steps of the prior art.
Figure 25B:
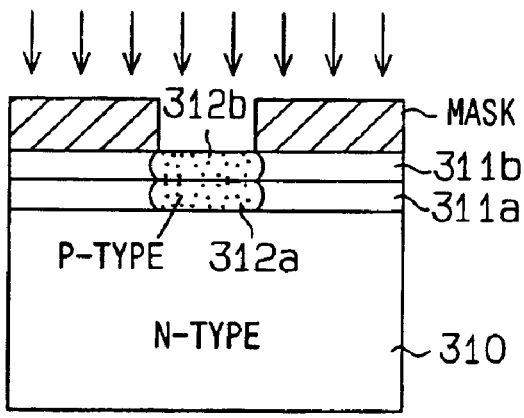
Figure 25C:
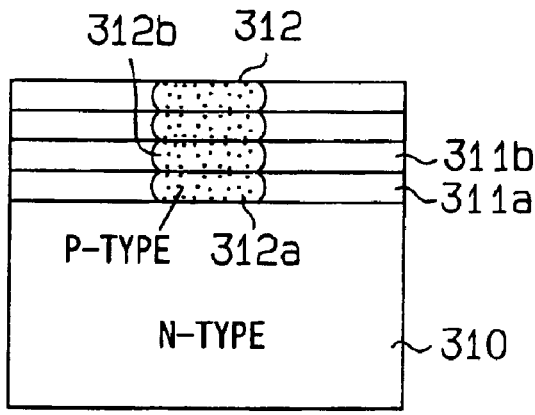
Figure 26A:
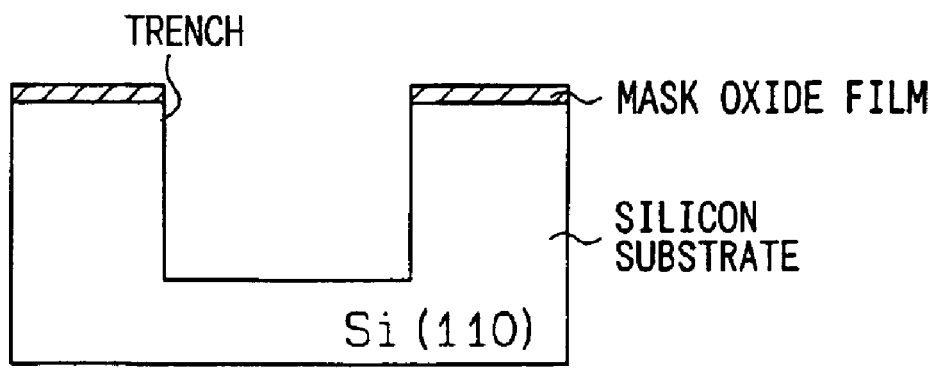
FIGS. 26A and 26B are schematic cross sectional views of a semiconductor substrate having a trench of related art.
Figure 26B:
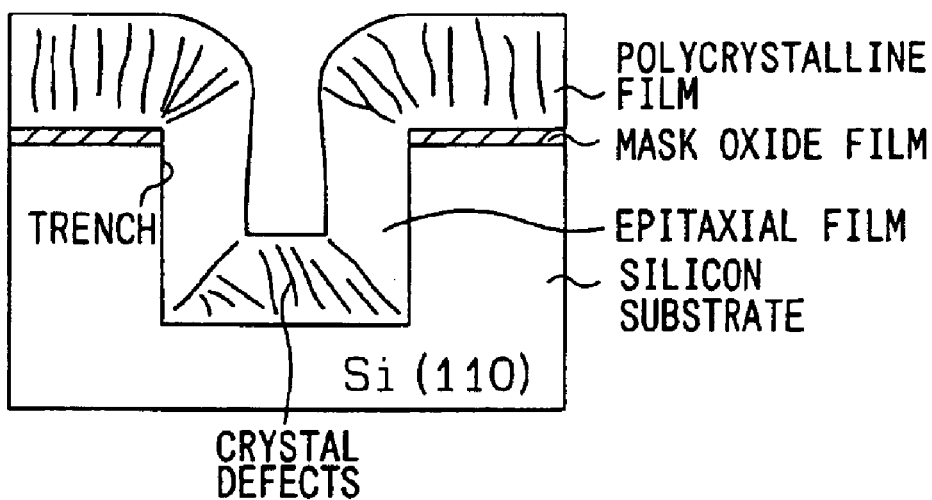

To the contrary, in *A New Generation of High Voltage MOSFETs Breaks the Limit of Silicon* by G. Deboy et al. (1998), or in JP-A-2000-40822, as shown in FIGS. 24A and 24B, an epitaxial film 311*a* is formed on a substrate 310, then, a diffusion layer 312*a* is formed by partial dopant ion implantation by a photolithography and thermal diffusion as shown in FIG. 24C. After that, as shown in FIGS. 25A and 25B, the epitaxial growth, the partial ion implantation and the thermal diffusion are repeated alternately, so that a diffusion layer 312 extending in a depth direction is formed as shown in FIG. 25C. In this manner, the thickness of the diffusion layer 312 depends on the thickness of the epitaxial growth, and it does not depend on the distance of diffused dopant impurities. However, the shape of a side face of this diffusion layer 312 has an irregularity and is not straight.

On the contrary, in this embodiment shown in FIG. 9, the inner surface of the trench 103 is smooth, and the side shape of the diffusion layer 107 is straight in the up and down direction. Therefore, the structure of the diffusion layer in this embodiment is preferred for obtaining a predetermined device characteristic.

Incidentally, the non-oxidizing and the non-nitriding thermal treatment also may be performed before the epitaxial growth in the first through the sixth embodiments.

Eighth Embodiment

An eighth embodiment will mainly be described based on differences from the seventh embodiment.

FIGS. 15A to 15C and 16A to 16C are schematic cross sectional views showing a manufacturing method of a semiconductor substrate.

Figure 16A:
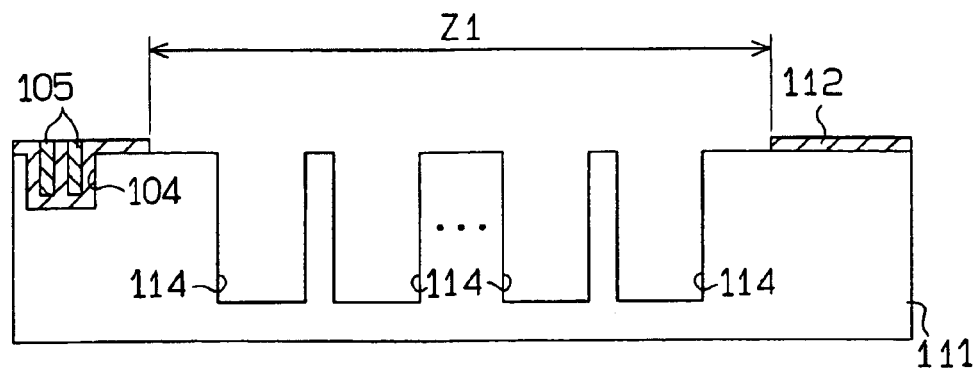
FIGS. 16A to 16C are schematic cross sectional views of a semiconductor substrate having a trench showing manufacturing steps of an eighth embodiment of the present invention.
Figure 16B:
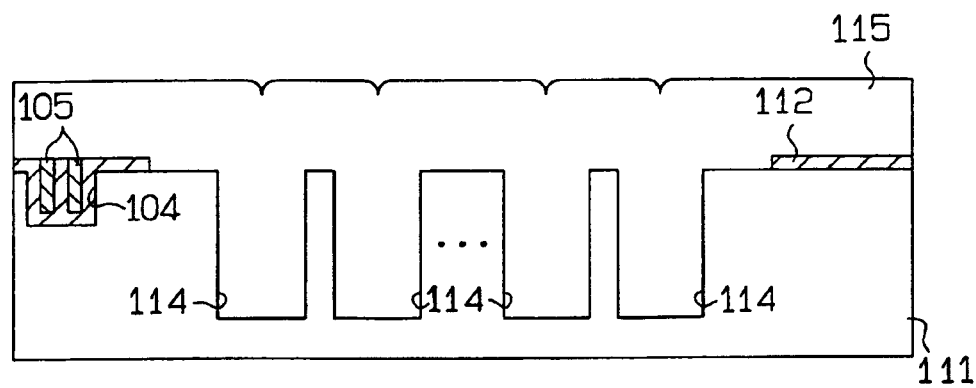
Figure 16C:
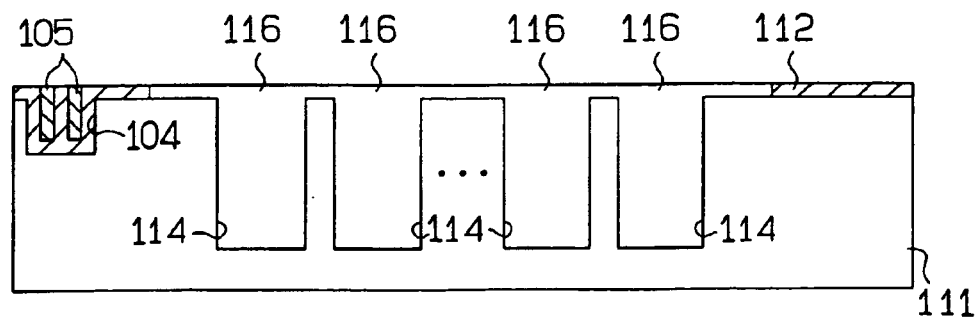

As shown in FIG. 16C, a trench 114 is formed in a silicon substrate (single crystal silicon substrate) 111 constituting a semiconductor substrate, and is filled with a single crystal silicon film (diffusion layer) 116.

In the seventh embodiment described above, since deterioration of process accuracy occurs easily, a mask oxide film is left in this embodiment. Namely, the mask oxide film is removed only from a region where trenches are formed in the substrate. After that, a thermal treatment and an epitaxial growth are conducted successively.

Figure 15A:
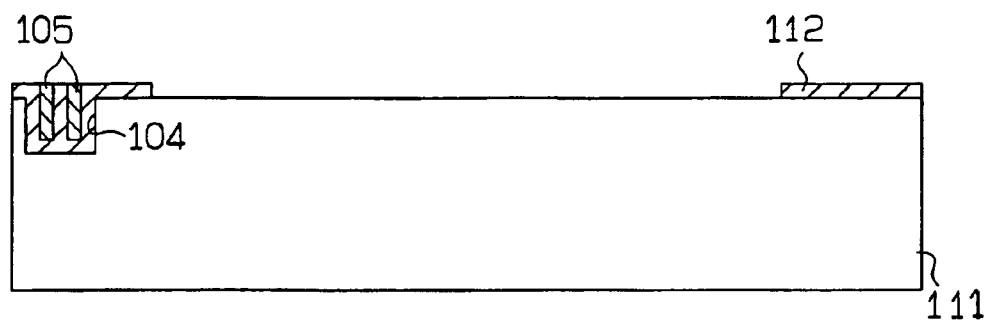
FIGS. 15A to 15C are schematic cross sectional views of a semiconductor substrate having a trench showing manufacturing steps of an eighth embodiment of the present invention.

First, as shown in FIG. 15A, an oxide film 112 is formed on the silicon substrate 111. Then, the oxide film 112 is removed at regions where the trenches 114 are to be formed.

Figure 15B:
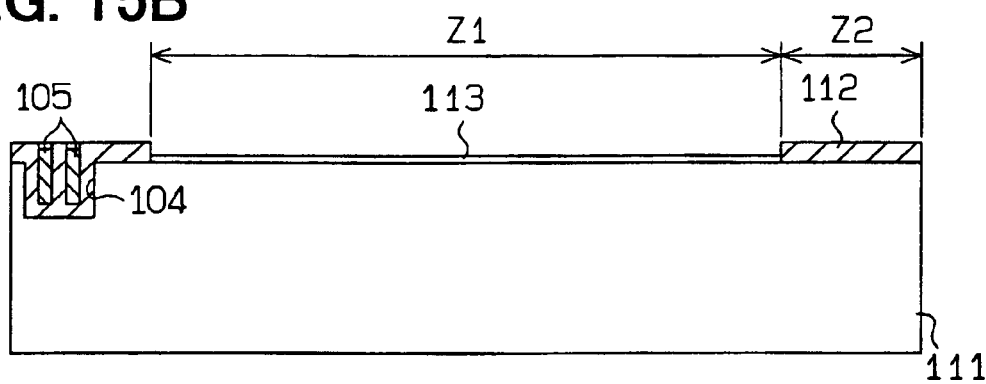

Next, as shown in FIG. 15B, a thick oxide film is formed. In detail, a trench forming region Z1 is defined as a region on which the oxide film 112 is removed. The trench forming region Z1 has an end portion whose distance from an edge portion of an outermost trench is larger than a length of an oxide film peeled off by a predetermined thermal treatment. Moreover, a field region Z2 is located at an outside the trench forming region Z1. Namely, a thin oxide film 113 is formed on the trench forming region Z1, and the oxide film 112 left on the field region Z2 is grown to be thick by a thermal oxidation. Then, the thin oxide film 113 is patterned.

Figure 15C:
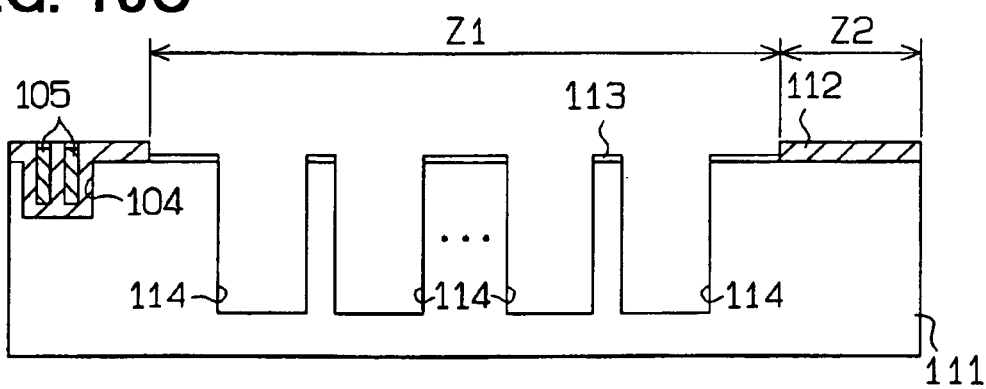

Further, as shown in FIG. 15C, the trenches 114 are formed by etching. After that, as shown in FIG. 16A, the mask oxide film 113 is removed at the trench forming region Z1 by cleaning with HF solution. At this time, natural oxide films formed in the trenches 114 are also removed. Then, as shown in FIG. 16B, after a thermal treatment (900 to 1200° C.) is performed to smooth inner surfaces of the trenches 114, an epitaxial film 115 is formed (800 to 1000° C. in low pressure atmosphere), whereby the trenches 114 are filled with the epitaxial film 115. Subsequently, as shown in FIG. 16C, polishing is performed to flatten the epitaxial film 115. In this step, the oxide film 112 left around the trenches 114 informs an end timing of the polishing.

As described above, although the oxide film is removed entirely in the seventh embodiment, in this embodiment, the oxide film formed on the field region Z2 is made thicker than the oxide film formed on the trench forming region Z1 previously. Accordingly, the oxide film formed on the trench forming region Z1 can be removed only. In other words, the mask oxide film 112 for forming the trenches at the field region Z2 where the trenches are not formed is made thicker than the mask oxide film 113 for forming the trenches at the trench forming region Z1 so that the mask oxide film 113 for forming the trenches at the trench forming region Z1 is only removed, and the mask oxide film 112 remains when mask oxide film etching is conducted. In this case, the oxide film 112 can be used as a stopper in the polishing for flattening.

Ninth Embodiment

A ninth embodiment will be described on different features from the seventh and eight embodiments mainly.

Figure 17A:
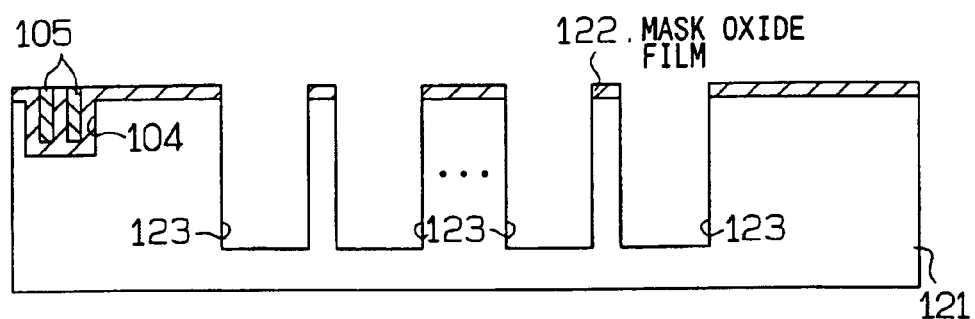
FIGS. 17A to 17C are schematic cross sectional views of a semiconductor substrate having a trench showing manufacturing steps of a ninth embodiment of the present invention.
Figure 17B:
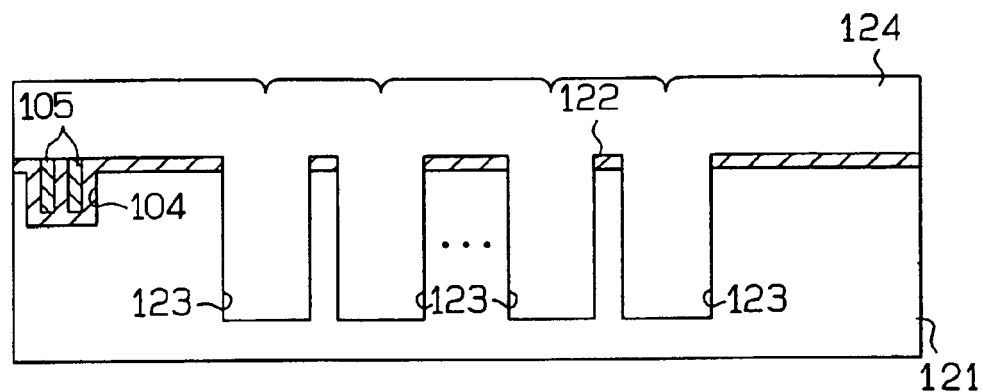
Figure 17C:
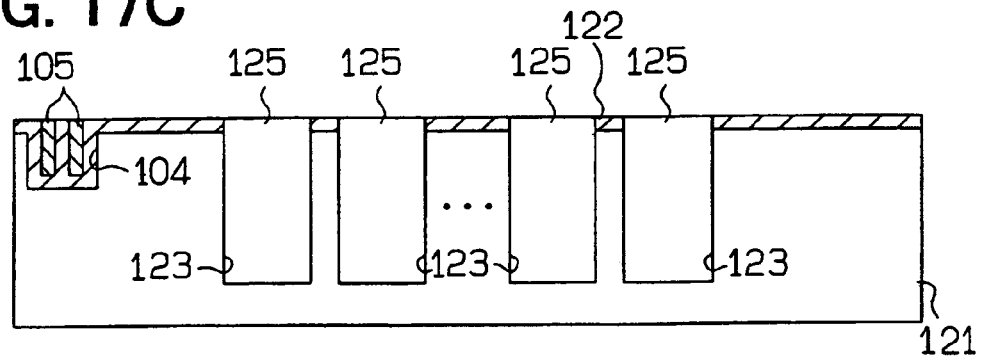

FIGS. 17A to 17C are schematic cross sectional views showing a manufacturing method of a semiconductor substrate.

In this embodiment, an epitaxial growth is conducted in a condition that a mask (oxide film) is left on a substrate, but a thermal treatment is restricted so that prevention of peeling off the oxide film (mask) and an improvement of crystallinity of an epitaxial film can be achieved simultaneously.

First, as shown in FIG. 17A, a mask oxide film 122 is formed on an upper surface of a silicon substrate 121, then, trenches 123 are formed by etching. After that, a thermal treatment for smoothing an inner surface of the trenches 123 is performed. The thermal treatment is performed at 900 to 1100° C. for several minutes to several dozens minutes.

After that, as shown in FIG. 17B, an epitaxial film 124 is deposited on the silicon substrate 121 and also deposited in the trenches 123 (800 to 1100° C. in low pressure atmosphere). After that, polishing is conducted to flatten the epitaxial film 124 formed on the substrate 121, whereby a substrate having diffusion layers 125 filling the trenches is obtained. Incidentally, the end time of the polishing is detected by use of the oxide film 122 located between two adjacent trenches.

Figure 18:
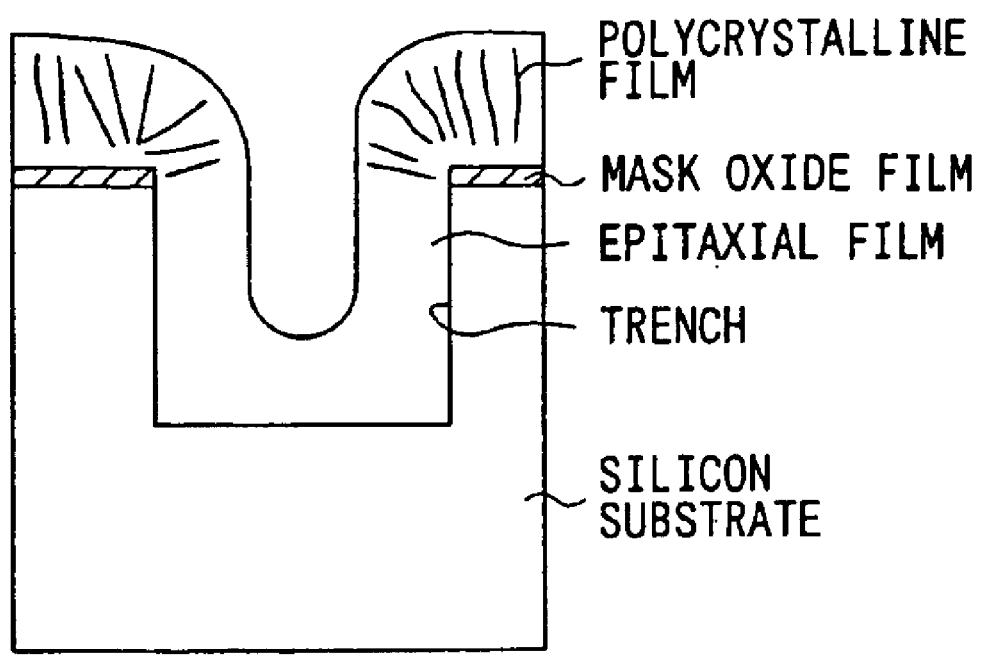
FIG. 18 is a schematic cross sectional view of a semiconductor substrate having a trench after polycrystalline film is grown.

FIG. 18 shows an observed result of a case that an epitaxial growth is conducted after a thermal treatment is conducted at 1100° C. for ten minutes with the mask oxide film. Crystallographic quality in the trench is in a good condition as understood from FIG. 18.

Tenth Embodiment

A tenth embodiment will be described on different features from the seventh, eighth and ninth embodiments mainly.

FIGS. 19A to 19D are schematic cross sectional views showing a manufacturing method of a semiconductor substrate.

In this embodiment, a thin epitaxial film is formed prior to forming an epitaxial film for burring trenches. After that, inner surfaces of the trenches are smoothed by a thermal treatment, whereby a mask oxide film is prevented from peeling off.

Figure 19A:
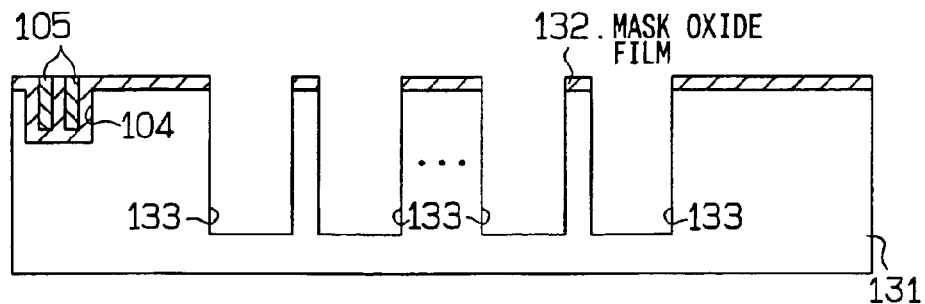
FIGS. 19A to 19D are schematic cross sectional views of a semiconductor substrate having a trench showing manufacturing steps of a tenth embodiment of the present invention.
Figure 19B:
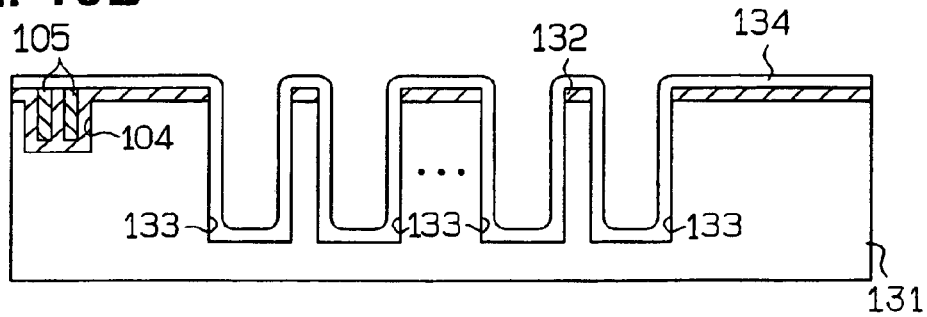

First, as shown in FIG. 19A, a mask oxide film 132 is formed on an upper surface of a silicon substrate 131 as a mask for a trench etching. Successively, trenches 133 are formed in the silicon substrate 131 by etching using the mask oxide film 132. Then, as shown in FIG. 19B, a first epitaxial film 134 is deposited on the silicon substrate 131 and also deposited in the trenches 133. The first epitaxial film 134 is formed at 800 to 1100° C., and a thickness of several micrometers. After the epitaxial film 134 is formed, roughness and crystal defects on inner surfaces of the trenches 133 also appear on a surface of the epitaxial film 134 (in other words, the film 134 inherits the roughness and the crystal defects from the inner surfaces of the trenches 133.). Therefore, the surface of the epitaxial film 134 is smoothed by a thermal treatment. The thermal treatment is conducted at 900 to 1200° C. for several minutes to several ten minutes.

Figure 19C:
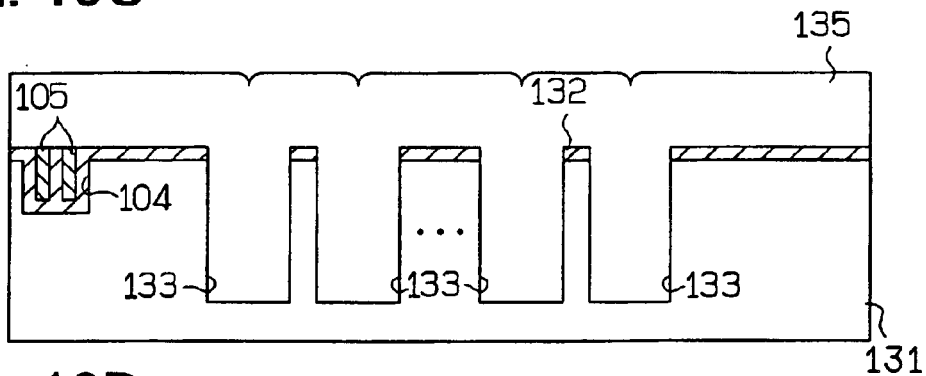

Then, as shown in FIG. 19C, a second epitaxial film 135 is deposited on the silicon substrate 131 and also deposited in the trenches 133, whereby the trenches 133 are filled with the epitaxial films. The epitaxial growth in this stage is performed at 800 to 1100° C.

Figure 19D:
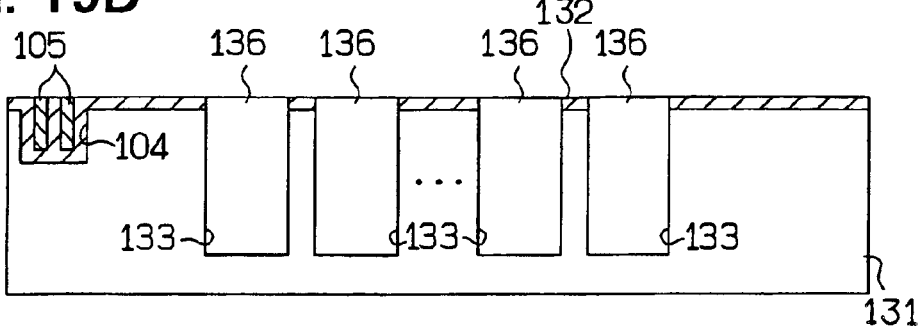

After that, as shown in FIG. 19D, the epitaxial film formed on the substrate 131 is flattened, whereby a substrate having diffusion layers 136 filling the trenches 133 is obtained.

As described above, the mask oxide film 132 is prevented from peeling off by the first epitaxial film 134. Moreover, the surface of the first epitaxial film 134 formed in the trenches is smoothed by the thermal treatment prior to forming the epitaxial film 35 for burring the trenches, so that crystallinity in growing the epitaxial film 135 is improved even though the roughness and the crystal defects are introduced on the inner surfaces of the trenches.

Eleventh Embodiment

An eleventh embodiment will be described on different features from the seventh to tenth embodiments mainly.

Figure 20A:
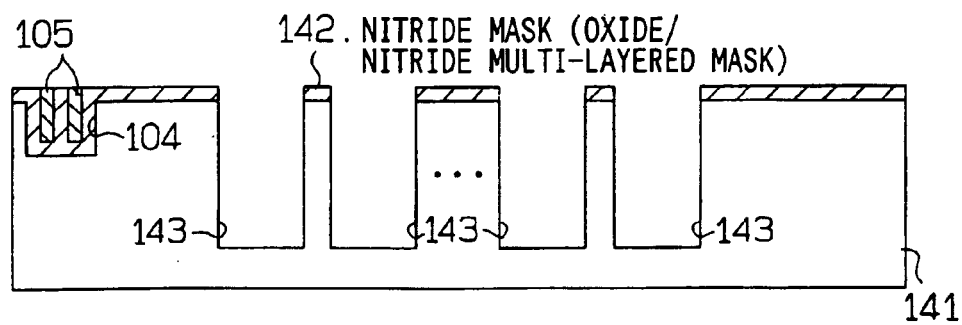
FIGS. 20A to 20C are schematic cross sectional views of a semiconductor substrate having a trench that show the manufacturing steps of an eleventh embodiment of the present invention.
Figure 20B:
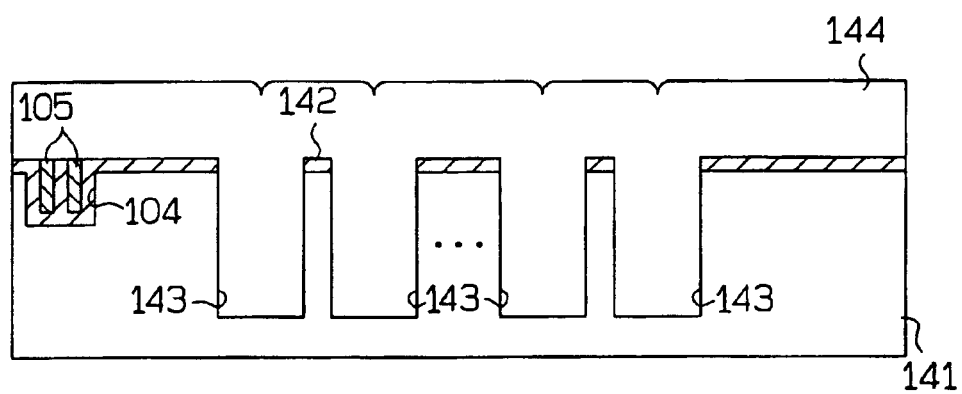
Figure 20C:
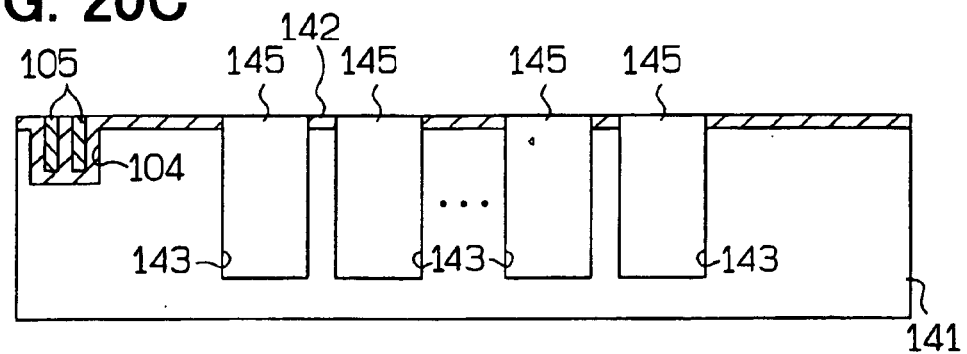

FIGS. 20A to 20C are schematic cross sectional views showing a manufacturing method of a semiconductor substrate.

In this embodiment, a material including a nitride film is used as a mask.

First, as shown in FIG. 20A, a mask 142 for forming trenches is formed on a silicon substrate 141. The mask is composed of the nitride film or a multiple layer composed of an oxide film and a nitride film. In this embodiment, an oxide film, a nitride film and an oxide film are deposited on the silicon substrate 141 alternately to form the multiple layers as the mask. Then, trenches 143 are formed by etching.

Next, after a thermal treatment is performed at 900 to 1200° C. to smooth inner surfaces of the trenches, as shown in FIG. 20B, an epitaxial film 144 is deposited on the silicon substrate 141 and also deposited in the trenches 143 (800 to 1100° C. in low pressure atmosphere). Then, the epitaxial film 144 formed on the substrate 141 is flattened, whereby a substrate having diffusion layers 145 filling the trenches 143.

As described above, the nitride film or the multiple layers composed of the oxide film and the nitride film is used as the mask instead of an oxide film. Since the mask including the nitride film does not cause a reaction of sublimation explained below, the mask is prevented from peeling off from an interface between silicon and the mask. In other words, the mask including the nitride film has bad fluidity when heat is applied. As a result, adhesion of the mask including the nitride film is enhanced when heat is applied.

The chemical equation is:

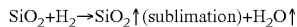

$SiO_2 + H_2 \rightarrow SiO_2\uparrow \text{(sublimation)} + H_2O\uparrow$

Another ways for smoothing an inner surface of a trench will be described.

i) After the trench is formed, a sacrificial oxide film is formed on an inner surface of the trench, then, the sacrificial oxide film is removed.

ii) After the trench is formed, isotropic etching is performed to the trench. For example, the isotropic etching is performed with a mixed solution of hydrofluoric acid and nitric acid, or performed by isotropic dry etching or isotropic wet etching.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor substrate comprising:

a trench formed in a semiconductor substrate, wherein the trench is open at an upper surface of the semiconductor substrate, wherein the depth of the trench is between 10 µm and 50 µm, and wherein a radius of curvature at a corner defined by a side face and a bottom face of the trench is 1.0 µm or more, and the maximum roughness height of an inner face of the trench is 3 nm or less due to a thermal treatment in a hydrogen atmosphere; and a single crystal semiconductor layer filling the trench, wherein the single crystal semiconductor layer is formed by filling the trench with an epitaxial film after a heat treatment is applied to the trench in a non-oxidizing or non-nitriding atmosphere under a low pressure, wherein the semiconductor substrate is a silicon substrate having a (110) face orientation, and wherein a side surface of the trench has a (111) face orientation, and a bottom surface of the trench has a (110) face orientation.

2. A semiconductor substrate comprising:

a trench formed in a semiconductor substrate, wherein the trench is open at an upper surface of the semiconductor substrate, and wherein a radius of curvature at a corner defined by a side face and a bottom face of the trench is 1.0 µm or more, and the maximum roughness height of an inner face of the trench is 3 nm or less; and a single crystal semiconductor layer filling the trench, wherein the single crystal semiconductor layer is formed by filling the trench with an epitaxial film after a heat treatment is applied to the trench in a non-oxidizing or non-nitriding atmosphere under a low pressure, wherein the semiconductor substrate is a silicon substrate having a (110) face orientation, and wherein a side surface of the trench has a (111) face orientation, and a bottom surface of the trench has a (110) face orientation.

3. The semiconductor substrate according to claim 2, wherein the single crystal semiconductor layer is a composite layer including a plurality of monocrystalline layers, each layer being a single crystal and having a different dopant concentration or a different conduction type.

4. The semiconductor substrate according to claim 2, wherein the inside surface of the trench in smoothed by a heat treatment.

5. A semiconductor substrate comprising:

a trench formed in a semiconductor substrate, wherein the trench is open at an upper surface of the semiconductor substrate, and wherein a radius of curvature at a corner defined by a side face and a bottom face of the trench is 1.5 µm or more, and the maximum roughness height of an inner face of the trench is 2 nm or less; and a single crystal semiconductor layer filling the trench, wherein the single crystal semiconductor layer is formed by filling the trench with an epitaxial film after a heat treatment is applied to the trench in a non-oxidizing or non-nitriding atmosphere under a low pressure, wherein the semiconductor substrate is a silicon substrate having a (110) face orientation, a side surface of the trench has a (111) face orientation, and a bottom surface of the trench has a (110) face orientation.

* * * * *